United States Patent
Ohtou et al.

(10) Patent No.: US 11,393,830 B2
(45) Date of Patent: Jul. 19, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Tetsu Ohtou, Hsinchu (TW); Ching-Wei Tsai, Hsinchu (TW); Kuan-Lun Cheng, Hsinchu (TW); Yasutoshi Okuno, Hsinchu (TW); Jiun-Jia Huang, Yunlin County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 60 days.

(21) Appl. No.: 16/876,416

(22) Filed: May 18, 2020

(65) Prior Publication Data
US 2020/0279853 A1 Sep. 3, 2020

Related U.S. Application Data

(62) Division of application No. 15/905,905, filed on Feb. 27, 2018, now Pat. No. 10,658,370.
(Continued)

(51) Int. Cl.
*H01L 27/11* (2006.01)
*H01L 27/088* (2006.01)
(Continued)

(52) U.S. Cl.
CPC .. *H01L 27/1104* (2013.01); *H01L 21/823418* (2013.01); *H01L 21/823431* (2013.01); *H01L 21/823468* (2013.01); *H01L 21/823481* (2013.01); *H01L 21/823807* (2013.01); *H01L 21/823814* (2013.01); *H01L 21/823821* (2013.01); *H01L 21/823864* (2013.01); *H01L 27/0886* (2013.01); *H01L 27/0924* (2013.01); *H01L 29/0649* (2013.01); *H01L 29/1095* (2013.01); *H01L 21/823878* (2013.01)

(58) Field of Classification Search
None
See application file for complete search history.

(56) References Cited

U.S. PATENT DOCUMENTS 9,324,870 B2 4/2016 Basker et al.
2018/0108656 A1 4/2018 Lin et al.
2019/0287859 A1* 9/2019 Huang ................ H01L 29/7848

* cited by examiner

*Primary Examiner* — Long Pham
(74) *Attorney, Agent, or Firm* — Birch, Stewart, Kolasch & Birch, LLP

(57) ABSTRACT

A method includes forming a first semiconductor fin and a second semiconductor fin over a substrate; forming an shallow trench isolation (STI) structure on the substrate and between the first semiconductor fin and the second semiconductor fin; forming a spacer layer on the first semiconductor fin, the second semiconductor fin, and the STI structure; patterning the spacer layer to form a spacer extending along the second sidewall of the first semiconductor fin, a top surface of the STI structure, and the second sidewall of the second semiconductor fin; forming a first epitaxy structure in contact with a top surface of the first semiconductor fin and the first sidewall of the first semiconductor fin; and forming a second epitaxy structure in contact with a top surface of the second semiconductor fin and the first sidewall of the second semiconductor fin.

20 Claims, 20 Drawing Sheets

Related U.S. Application Data

(60) Provisional application No. 62/526,432, filed on Jun. 29, 2017.

(51) Int. Cl.
    *H01L 29/10*     (2006.01)
    *H01L 21/8234*     (2006.01)
    *H01L 29/06*     (2006.01)
    *H01L 21/8238*     (2006.01)
    *H01L 27/092*     (2006.01)

SEMICONDUCTOR DEVICE AND MANUFACTURING METHOD THEREOF

PRIORITY CLAIM AND CROSS-REFERENCE

The present application is a Divisional application of U.S. application Ser. No. 15/905,905, filed on Feb. 27, 2018, now U.S. Pat. No. 10,658,370, issued on May 19, 2020, which claims priority to U.S. Provisional Application Ser. No. 62/526,432, filed Jun. 29, 2017, which is herein incorporated by reference.

BACKGROUND

Static Random Access Memory (Static RAM or SRAM) is a semiconductor memory that retains data in a static form as long as the memory has power. SRAM is faster and more reliable than the more common dynamic RAM (DRAM). The term static is derived from the fact that it doesn't need to be refreshed like DRAM. SRAM is used for a computer's cache memory and as part of the random access memory digital-to-analog converter on a video card.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
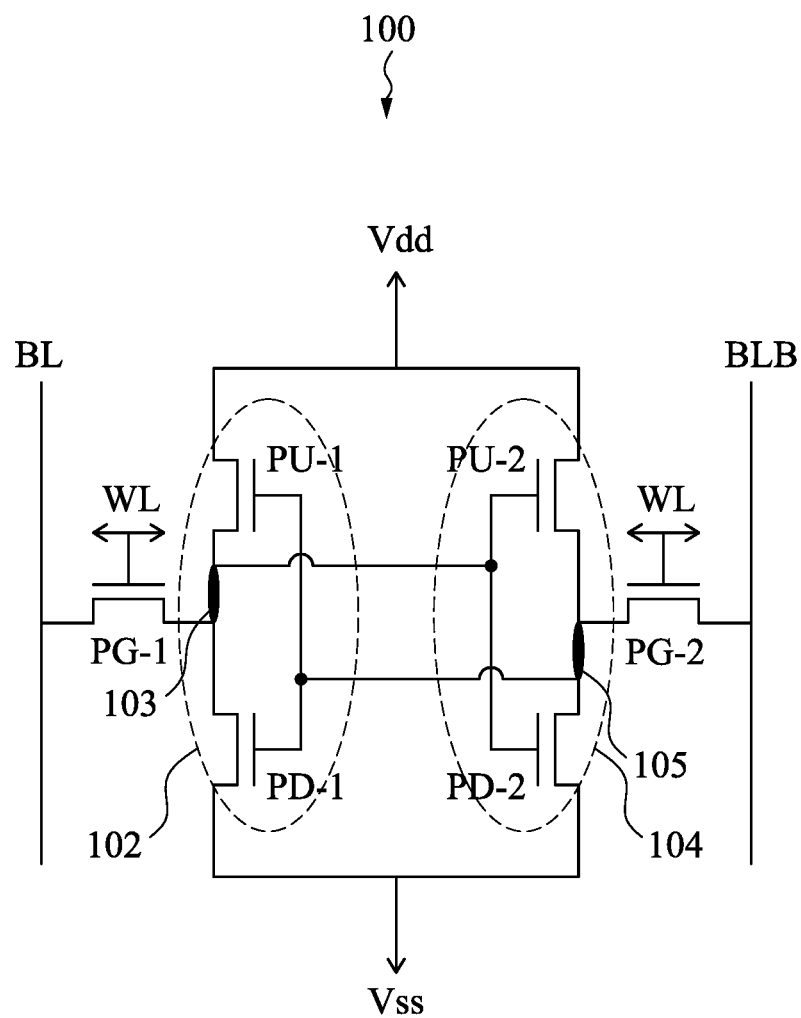
FIG. 1 is a circuit diagram of a six transistor (6T) SRAM cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a static random-access memory (SRAM) formed of fin field effect transistors (FinFETs). The embodiments of the disclosure may also be applied, however, to a variety of semiconductor devices. Various embodiments will be explained in detail with reference to the accompanying drawings.

Static random-access memory (SRAM) is a type of volatile semiconductor memory that uses bistable latching circuitry to store bits. Bit in an SRAM is stored on four transistors (PU-1, PU-2, PD-1, and PD-2) that form two cross-coupled inverters. This memory cell has two stable states which are used to denote 0 and 1. Two additional access transistors (PG-1 and PG-2) are electrically connected to the two cross-coupled inventors and serve to control the access to a storage cell during read and write operations.

FIG. 1 is a circuit diagram of a six transistor (6T) SRAM cell. The SRAM cell 100 includes a first inverter 102 formed by a pull-up transistor PU-1 and a pull-down transistor PD-1. The SRAM cell 100 further includes a second inverter 104 formed by a pull-up transistor PU-2 and a pull-down transistor PD-2. Furthermore, both the first inverter 102 and second inverter 104 are coupled between a voltage bus Vdd and a ground potential Vss. In some embodiment, the pull-up transistor PU-1 and PU-2 can be p-type transistors while the pull-down transistors PD-1 and PD-2 can be n-type transistors, and the claimed scope of the present disclosure is not limited in this respect.

In FIG. 1, the first inverter 102 and the second inverter 104 are cross-coupled. That is, the first inverter 102 has an input connected to the output of the second inverter 104. Likewise, the second inverter 104 has an input connected to the output of the first inverter 102. The output of the first inverter 102 is referred to as a storage node 103. Likewise, the output of the second inverter 104 is referred to as a storage node 105. In a normal operating mode, the storage node 103 is in the opposite logic state as the storage node 105. By employing the two cross-coupled inverters, the SRAM cell 100 can hold the data using a latched structure so that the stored data will not be lost without applying a refresh cycle as long as power is supplied through Vdd.

In an SRAM device using the 6T SRAM cells, the cells are arranged in rows and columns. The columns of the SRAM array are formed by a bit line pairs, namely a first bit line BL and a second bit line BLB. The cells of the SRAM device are disposed between the respective bit line pairs. As shown in FIG. 1, the SRAM cell 100 is placed between the bit line BL and the bit line BLB.

In FIG. 1, the SRAM cell 100 further includes a first pass-gate transistor PG-1 connected between the bit line BL and the output 103 of the first inverter 102. The SRAM cell 100 further includes a second pass-gate transistor PG-2 connected between the bit line BLB and the output 105 of the second inverter 104. The gates of the first pass-gate transistor PG-1 and the second pass-gate transistor PG-2 are connected to a word line WL, which connects SRAM cells in a row of the SRAM array.

In operation, if the pass-gate transistors PG-1 and PG-2 are inactive, the SRAM cell 100 will maintain the complementary values at storage nodes 103 and 105 indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

In the circuit diagram of FIG. 1, the pull-up transistors PU-1, PU-2 are p-type transistors. The pull-down transistors PD-1, PD-2, and the pass-gate transistors PG-1, PG-2 are n-type transistors. In some other embodiments, however, the pull-up transistors PU-1, PU-2 are n-type transistors, and the pull-down transistors PD-1, PD-2, and the pass-gate transistors PG-1, PG-2 are p-type transistors. According to various embodiments, the pull-up transistors PU-1, PU-2, the pull-down transistors PD-1, PD-2, and the pass-gate transistors PG-1, PG-2 are implemented by FinFETs.

The structure of the SRAM cell 100 in FIG. 1 is described in the context of the 6T-SRAM. One of ordinary skill in the art, however, should understand that features of the various embodiments described herein may be used for forming other types of devices, such as an 8T-SRAM memory device, or memory devices other than SRAMs, such as standard cell, gated diode or ESD (Electrostatic Discharge) devices. Furthermore, embodiments of the present disclosure may be used as stand-alone memory devices, memory devices integrated with other integrated circuitry, or the like.

Figure 2A:
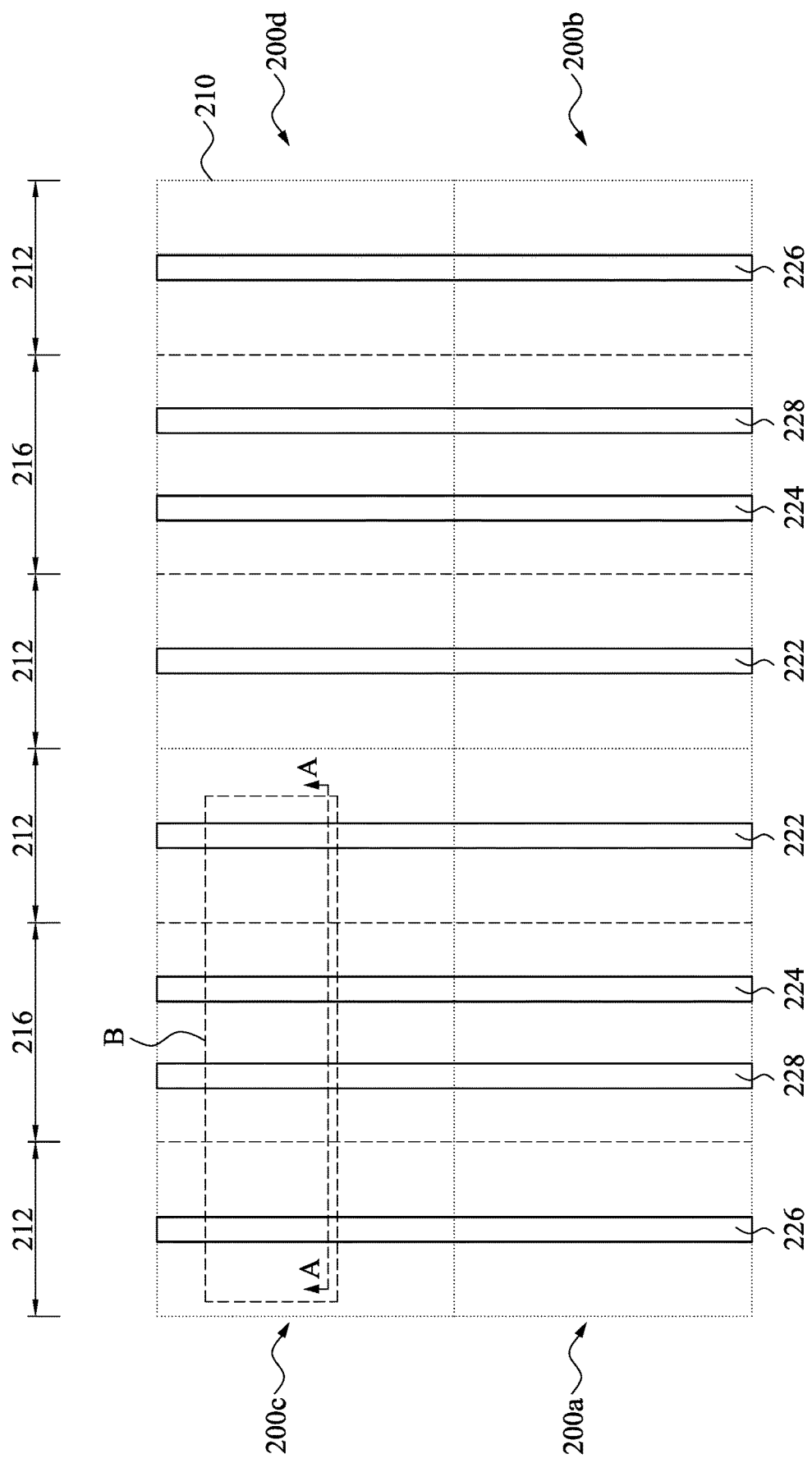
FIGS. 2A, 3A and 4A are top views of a method for manufacturing a semiconductor device at various stages in accordance with some embodiments of the present disclosure.
Figure 2B:
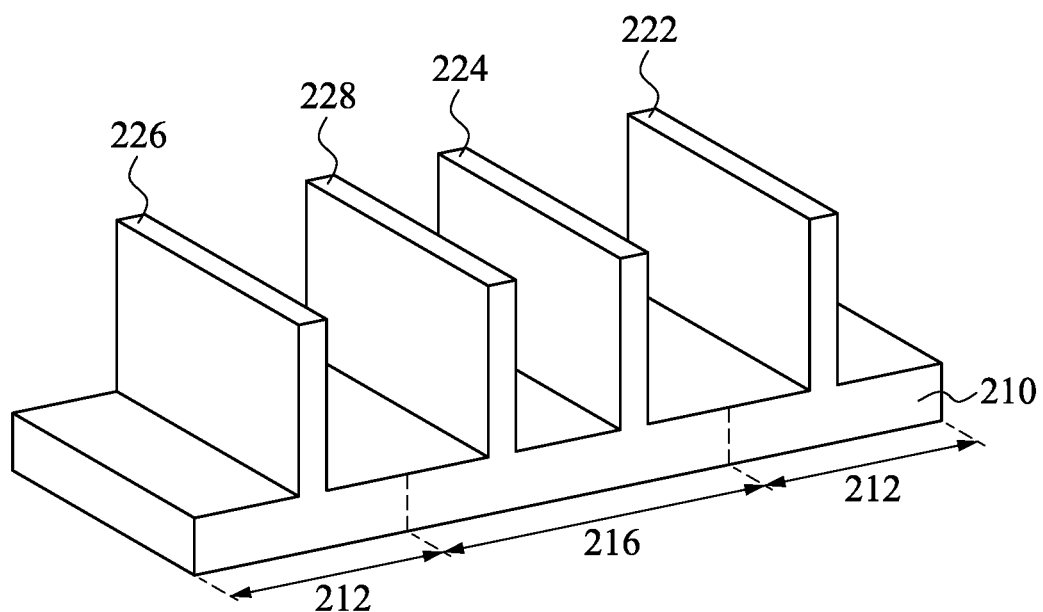
FIGS. 2B, 3B, and 4B are perspective views of area B of FIGS. 2A, 3A and 4A.
Figure 2C:
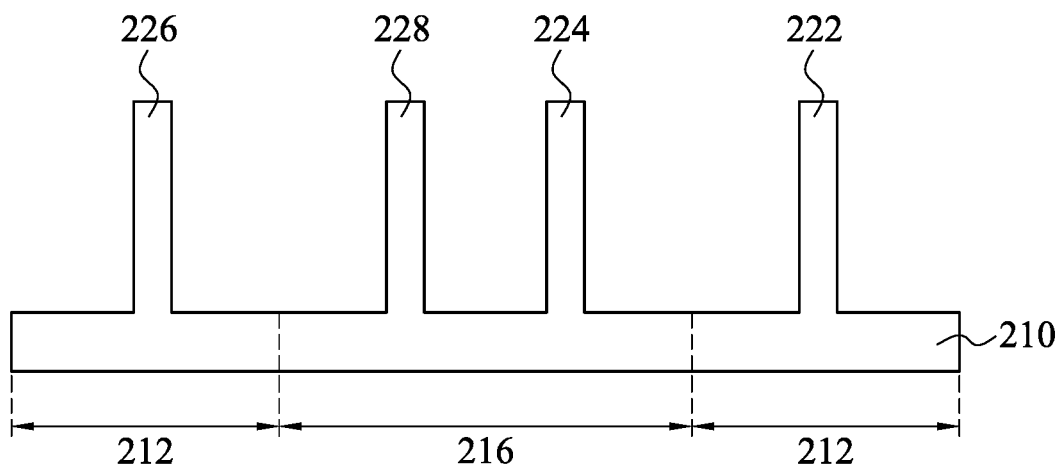
FIGS. 2C and 3C are cross-sectional views of line A-A of FIGS. 2A and 3A.
Figure 3A:
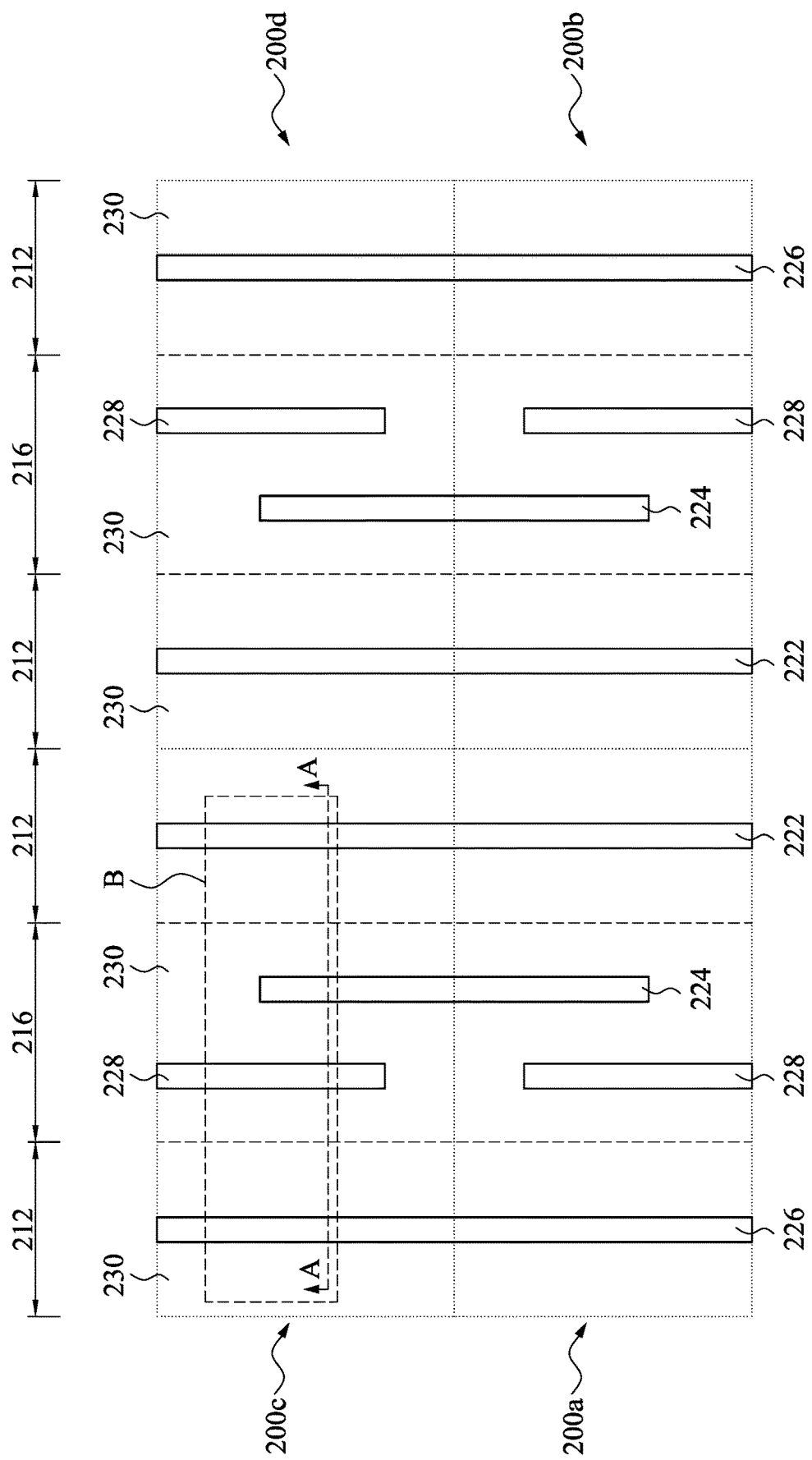
Figure 3B:
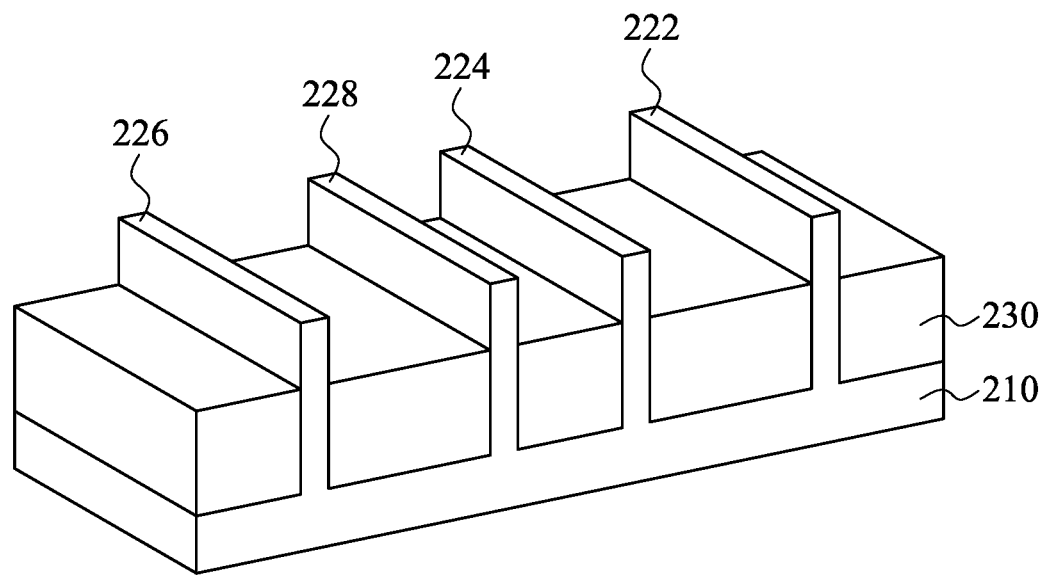
Figure 3C:
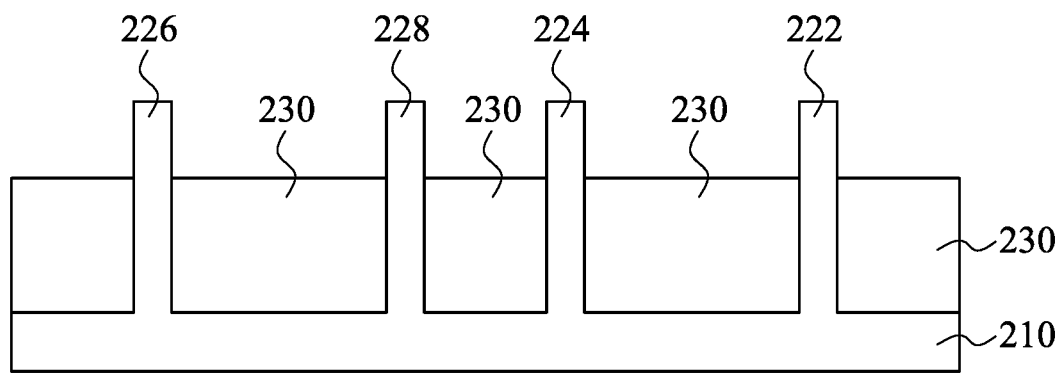
Figure 4A:
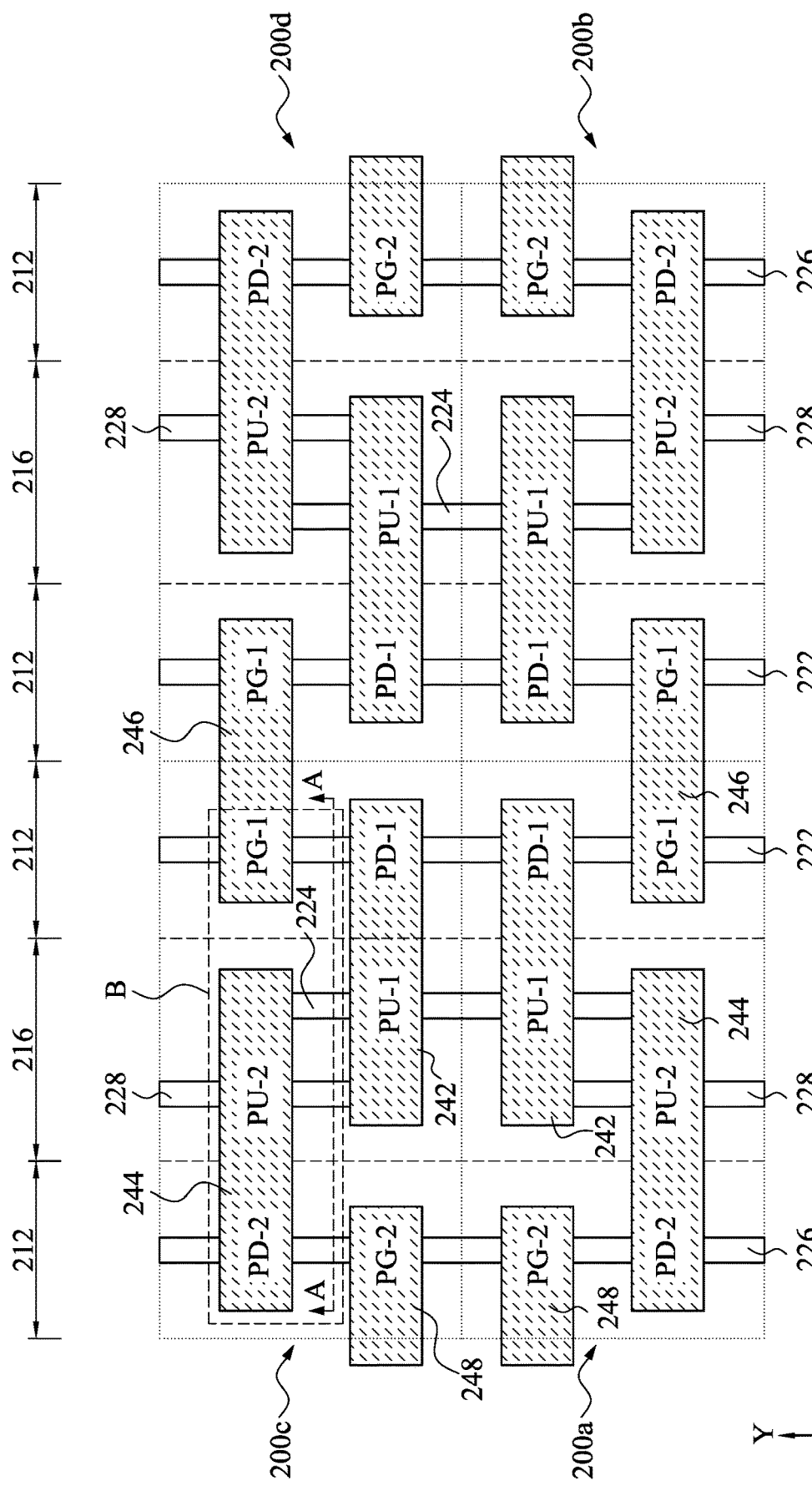
Figure 4B:
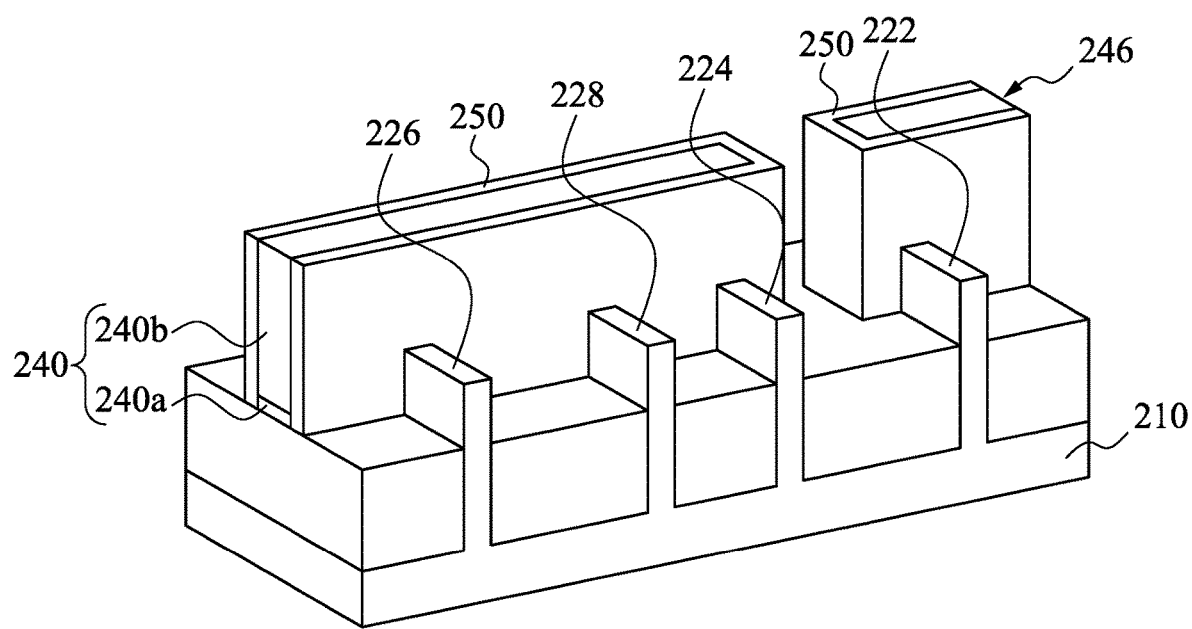
Figure 5A:
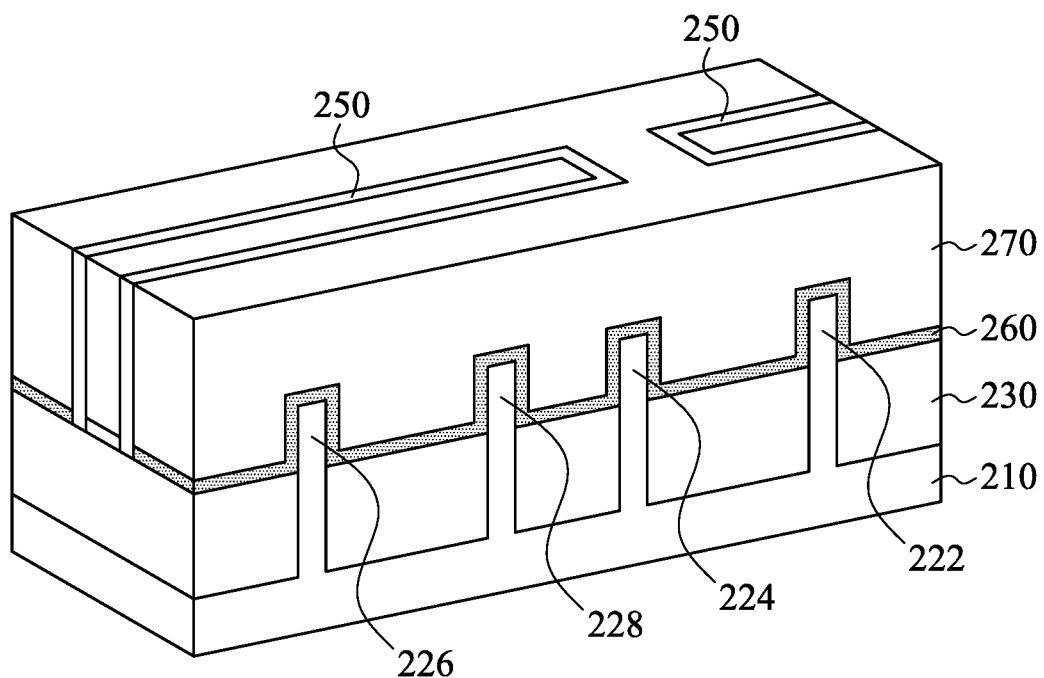
FIGS. 5A, 6A, 7A, 8A, 9A, 10A, 11A, and 12A are perspective views of area B of FIG. 4A in the following processes.
Figure 5B:
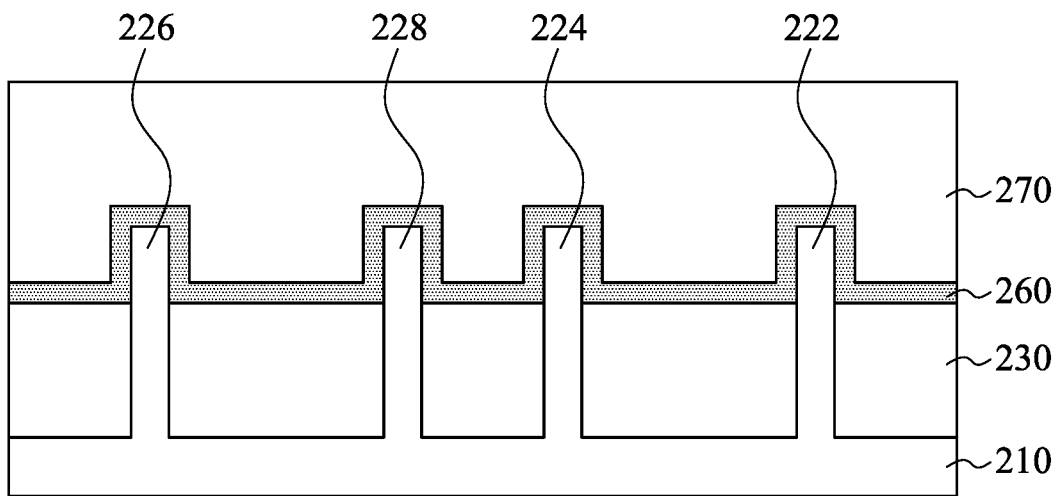
FIGS. 5B, 6B, 7B, 8B, 9B, 10B, 11B, and 12B are cross-sectional views of line A-A of FIG. 4A in the following processes.

FIGS. 2A, 3A and 4A are top views of a method for manufacturing a semiconductor device at various stages in accordance with some embodiments of the present disclosure. FIGS. 2B, 3B, and 4B are perspective views of area B of FIGS. 2A, 3A and 4A. FIGS. 5A. 6A, 7A, 8A, 9A, 10A, 11A. 12A are perspective views of area B of FIG. 4A in the following processes. FIGS. 2C and 3C are cross-sectional views of line A-A of FIGS. 2A and 3A. FIGS. 5B. 6B, 7B, 8B, 9B, 10B, 11B. 12B are cross-sectional views of line A-A of FIG. 4A in the following processes.

In FIG. 2A, the semiconductor device can be a SRAM device including four SRAM cells 200a, 200b, 200c, and 200d. In some other embodiments, however, the number of the SRAM cells 200a, 200b, 200c, and 200d in the SRAM device is not limited in this respect.

Reference is made to FIGS. 2A, 2B, and 2C. A substrate 210 is provided. In some embodiments, the substrate 210 may be a semiconductor material and may include known structures including a graded layer or a buried oxide, for example. In some embodiments, the substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 210. Alternatively, the silicon substrate 210 may be an active layer of a semiconductor-on-insulator (SOI) substrate or a multi-layered structure such as a silicon-germanium layer formed on a bulk silicon layer.

A plurality of p-well regions 212 and a plurality of n-well regions 216 are formed in the substrate 210. One of the n-well regions 216 is formed between two of the p-well regions 212. The p-well regions 212 are implanted with P dopant material, such as boron ions, and the n-well regions 216 are implanted with N dopant material such as arsenic ions. During the implantation of the p-well regions 212, the n-well regions 216 are covered with masks (such as photoresist), and during implantation of the n-well regions 216, the p-well regions 212 are covered with masks (such as photoresist).

A plurality of semiconductor fins 222, 224, 226, and 228 are formed on the substrate 210. In greater detail, the semiconductor fins 222 and 226 are formed on the p-well regions 212, and the semiconductor fins 224 and 228 are formed on the n-well regions 216. The semiconductor fin 222 is adjacent to the semiconductor fin 224, and the semiconductor fin 226 is adjacent to the semiconductor fin 228. In some embodiments, the semiconductor fins 222, 224, 226, and 228 include silicon. It is note that the number of the semiconductor fins 222, 224, 226, and 228 in FIGS. 2B and 2C is illustrative, and should not limit the claimed scope of the present disclosure. A person having ordinary skill in the art may select suitable number for the semiconductor fins 222, 224, 226, and 228 according to actual situations.

The semiconductor fins 222, 224, 226, and 228 may be formed, for example, by patterning and etching the substrate 210 using photolithography techniques. In some embodiments, a layer of photoresist material (not shown) is deposited over the substrate 210. The layer of photoresist material is irradiated (exposed) in accordance with a desired pattern (the semiconductor fins 222, 224, 226, and 228 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

Reference is made to FIGS. 3A, 3B, and 3C. A portion of the semiconductor fins 224 and 228 are removed. For example, a photomask (not shown) containing patterns for both the semiconductor fins 224 and 228 are used to protect portions of the semiconductor fins 224 and 228 to be kept. Exposed portions of both the semiconductor fins 224 and 228 are then etched at the same time.

A plurality of isolation structures 230 are formed on the substrate 210. The isolation structures 230 are formed between the semiconductor fins 226 and 228, between the semiconductor fins 228 and 224, and between the semiconductor fins 224 and 222. The isolation structures 230, which act as a shallow trench isolation (STI) around the semiconductor fins 222, 224, 226, and 228, may be formed by chemical vapor deposition (CVD) techniques using tetra-ethyl-ortho-silicate (TEOS) and oxygen as a precursor. In some other embodiments, the isolation structures 230 may be formed by implanting ions, such as oxygen, nitrogen, carbon, or the like, into the substrate 210. In yet some other embodiments, the isolation structures 230 are insulator layers of a SOI wafer.

Reference is made to FIGS. 4A, and 4B. A plurality of gate stacks 242, 244, 246, and 248 are formed on portions of the semiconductor fins 222, 224, 226, and 228 and expose another portions of the semiconductor fins 222, 224, 226, and 228. In greater detail, the gate stack 242 is formed on portions of the semiconductor fins 222, 224, and further on a portion of the semiconductor fin 228 in some embodiments; the gate stack 244 is formed on portions of the semiconductor fins 226 and 228, and further on a portion of the semiconductor fin 224 in some embodiments; the gate stack 246 is formed on portions of the semiconductor fins 222, and the gate stack 248 is formed on portions of the semiconductor fins 226.

As shown in FIG. 4B, at least one of the gate stacks 242, 244, 246, and 248 includes a gate insulator layer 240a and a gate electrode layer 240b. The gate insulator layer 240a is disposed between the gate electrode layer 240b and the substrate 210, and is formed on the semiconductor fins 222, 224, 226, and 228. The gate insulator layer 240a, which prevents electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate insulator layer 240a may have a multilayer structure such as one layer of silicon oxide (e.g., interfacial layer) and another layer of high-k material.

The gate insulator layer 240a may be formed using chemical vapor deposition (CVD), physical vapor deposition (PVD), atomic layer deposition (ALD), thermal oxide, ozone oxidation, other suitable processes, or combinations thereof. The gate electrode layers 240b are formed over the substrate 210 to cover the gate insulator layers 240a and the portions of the semiconductor fins 222, 224, 226, and 228. In some embodiments, the gate electrode layer 240b includes a semiconductor material such as polysilicon, amorphous silicon, or the like. The gate electrode layer 240b may be deposited doped or undoped. For example, in some embodiments, the gate electrode layer 240b includes polysilicon deposited undoped by low-pressure chemical vapor deposition (LPCVD). The polysilicon may also be deposited, for example, by furnace deposition of an in-situ doped polysilicon. Alternatively, the gate electrode layer 240b may include a polysilicon metal alloy or a metal gate including metals such as tungsten (W), nickel (Ni), aluminum (Al), tantalum (Ta), titanium (Ti), or any combination thereof.

In FIG. 4B, a plurality of gate spacers 250 are formed over the substrate 210 and along the side of the gate stacks 242, 244, 246, and 248. For clarity, the gate spacers 250 are illustrated in FIG. 4B and are omitted in FIG. 4A. In some embodiments, the gate spacers 250 may include silicon oxide, silicon nitride, silicon oxy-nitride, or other suitable material. The gate spacers 250 may include a single layer or multilayer structure. A blanket layer of the gate spacers 250 may be formed by CVD, PVD, ALD, or other suitable technique. Then, an anisotropic etching is performed on the blanket layer to form a pair of the gate spacers 250 on two sides of the gate stacks 242, 244, 246, and 248. In some embodiments, the gate spacers 250 are used to offset subsequently formed doped regions, such as source/drain regions. The gate spacers 250 may further be used for designing or modifying the source/drain region (junction) profile.

In FIG. 4A, the semiconductor fin 222 and the gate stack 242 form a pull-down transistor PD-1, and the semiconductor fin 224 and the gate stack 242 form a pull-up transistor PU-1. In other words, the pull-down transistor PD-1 and the pull-up transistor PU-1 share the gate stack 242. The semiconductor fin 226 and the gate stack 244 form another pull-down transistor PD-2, and the semiconductor fin 228 and the gate stack 244 form another pull-up transistor PU-2. In other words, the pull-down transistor PD-2 and the pull-up transistor PU-2 share the gate stack 244. Moreover, the semiconductor fin 222 and the gate stack 246 form a pass-gate transistor PG-1. In other words, the pass-gate transistor PG-1 and the pull-down transistor PD-1 share the semiconductor fin 222. The semiconductor fin 226 and the gate stack 248 form another pass-gate transistor PG-2. In other words, the pass-gate transistor PG-2 and the pull-down transistor PD-2 share the semiconductor fin 226. Therefore, the SRAM cell 200a is a six-transistor (6T) SRAM. One of ordinary skill in the art, however, should understand that features of the various embodiments described herein may be used for forming other types of devices, such as an 8T-SRAM memory device.

In some embodiments, the number of the semiconductor fins 222 can be plural, and/or the number of the semiconductor fins 226 can be plural. Therefore, the pull-down transistors PD-1, PD-2, and the pass-gate transistors PG-1, PG-2 have a plurality of semiconductor fins per transistor, and the pull-up transistors PU-1 and PU-2 have one semiconductor fin per transistor, and the claimed scope is not limited in this respect.

In FIG. 4A, when the SRAM cells 200a-200d are arranged together to form an array (the SRAM device herein), the cell layouts may be flipped or rotated to enable higher packing densities. Often by flipping the cell over a cell boundary or axis and placing the flipped cell adjacent the original cell, common nodes and connections can be combined to increase packing density. For example, the SRAM cells 200a-200d are mirror images and in rotated images of each other. Specifically, the SRAM cells 200a and 200b are mirror images across a Y-axis, as is SRAM cells 200c and 200d. The SRAM cells 200a and 200c are mirror images across an X-axis, as is SRAM cells 200b and 200d. Further, the diagonal SRAM cells (the SRAM cells 200a and 200d; the SRAM cells 200b and 200c) are rotated images of each other at 180 degrees.

Reference is made to FIGS. 5A and 5B. A spacer layer 260 is formed over the substrate 210, and covers the semiconductor fins 222, 224, 226, and 228, and further covers the isolation structures 230. The spacer layer 260 may include a dielectric material such as silicon oxide. Alternatively, the spacer layer 260 may include silicon nitride, SiC, SiON, or combinations thereof. After the spacer layer 260 is formed, a dielectric layer 270 is then formed over the substrate and on the spacer layer 260. The material of the spacer layer 260 and the dielectric layer 270 may be the same or may be different in embodiments. In some embodiments, the spacer layer 260 and the dielectric layer 270 are made from different materials to provide etching selectivity.

The gate spacers 250 and the spacer layer 260 may be the same or may be different in embodiments. In some embodiments where the gate spacers 250 and the spacer layer 260 are made of the same material, the gate spacers 250 and the spacer layer 260 may be formed by the same process, such as CVD, PVD, ALD, or suitable process(es). In some embodiments where the gate spacers 250 and the spacer layer 260 are made of different materials, the gate spacers 250 and the spacer layer 260 are formed by different processes, as described in FIGS. 4A-5B.

Figure 6A:
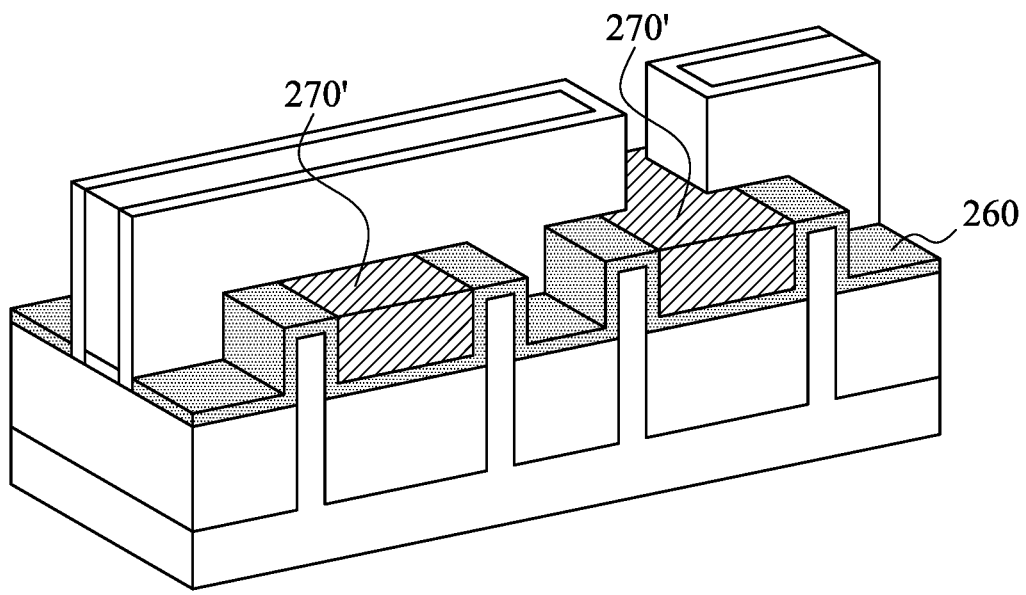
Figure 6B:
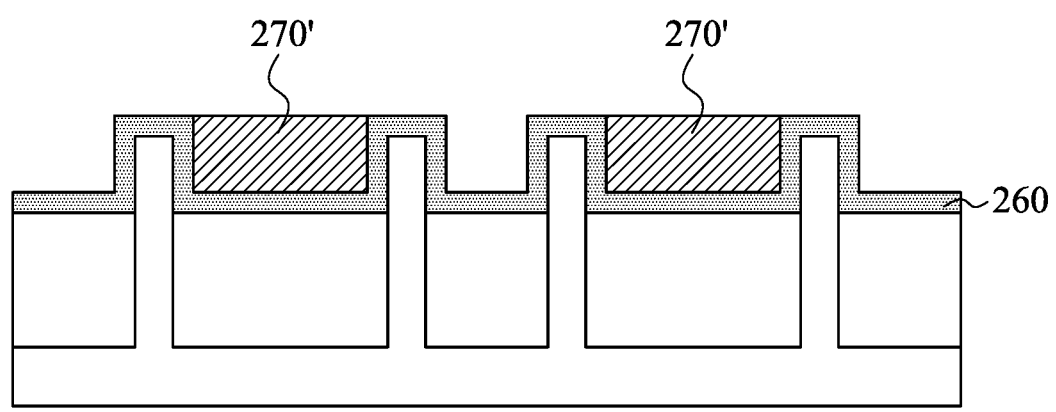

Reference is made to FIGS. 6A and 6B. The dielectric layer 270 in FIGS. 5A and 5B is patterned to form a plurality of the dielectric materials 270' on the spacer layer 260. The dielectric layer 270 may be patterned by one or more etching process(es).

The etching process may include dry etching process, wet etching process, and/or combinations thereof. The etching process may also include a selective wet etch or a selective dry etch. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH$_4$OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Figure 7A:
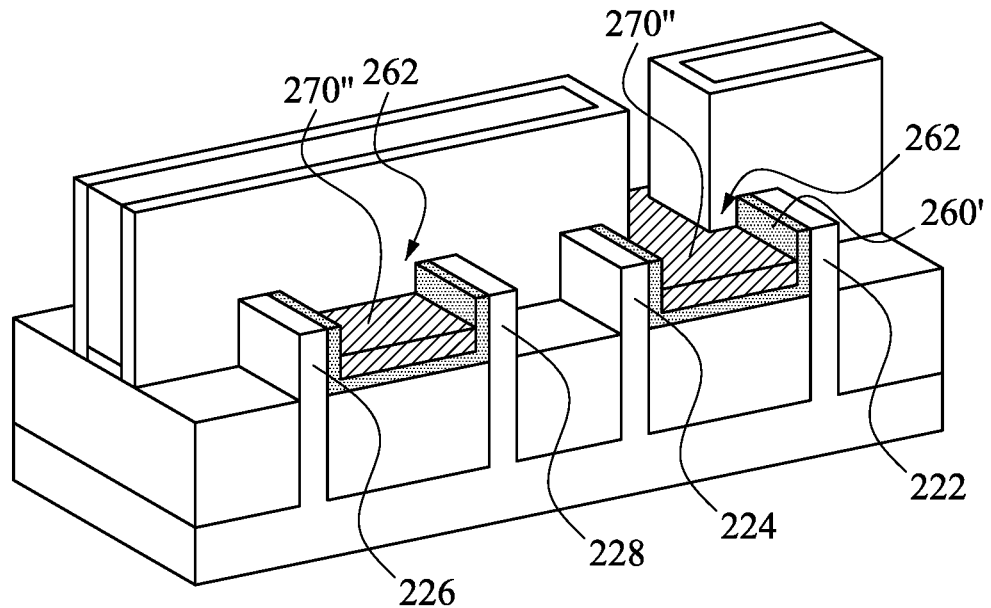
Figure 7B:
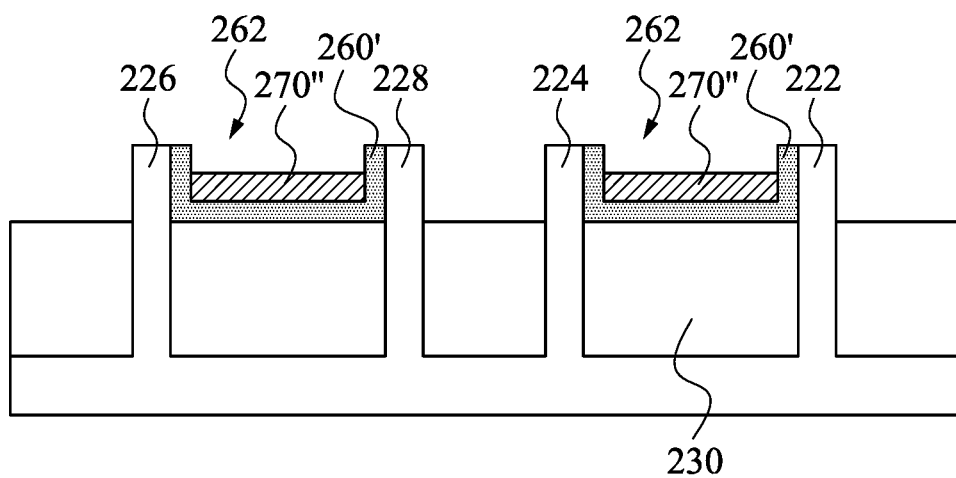

Reference is made to FIGS. 7A and 7B. The spacer layer 260 in FIGS. 6A and 6B is patterned to form a plurality of spacers 260'. In greater details, portions of the spacer layer 260 are removed, and the remained spacers 260' are disposed between the semiconductor fins 226 and 228, and between the semiconductor fins 222 and 224. One of the spacers 260' has a recess 262 therein. Moreover, one of the spacers 260' is in contact with the isolation structures 230 and semiconductor fins 226 and 228, and another one of the spacers 260' is in contact with the isolation structures 230 and semiconductor fins 222 and 224. From the other view, the portions of the isolation structures 230 are disposed under the spacers 260' and between the semiconductor fins 222 and 224, or between the semiconductor fins 226 and 228.

The spacer layer 260 may be patterned by one or more suitable etching process(es). In some embodiments, during the patterning of the spacer layer 260, the dielectric materials 270' (see FIGS. 6A and 6B) are partially removed. Accordingly, the remained dielectric materials 270" are disposed respectively in the recesses 262 between the spacers 260'. In some other embodiments, the dielectric materials 270' and the spacer layer 260 have etching selectivity, such that the dielectric materials 270' remain during the patterning of the spacer layer 260.

Figure 8A:
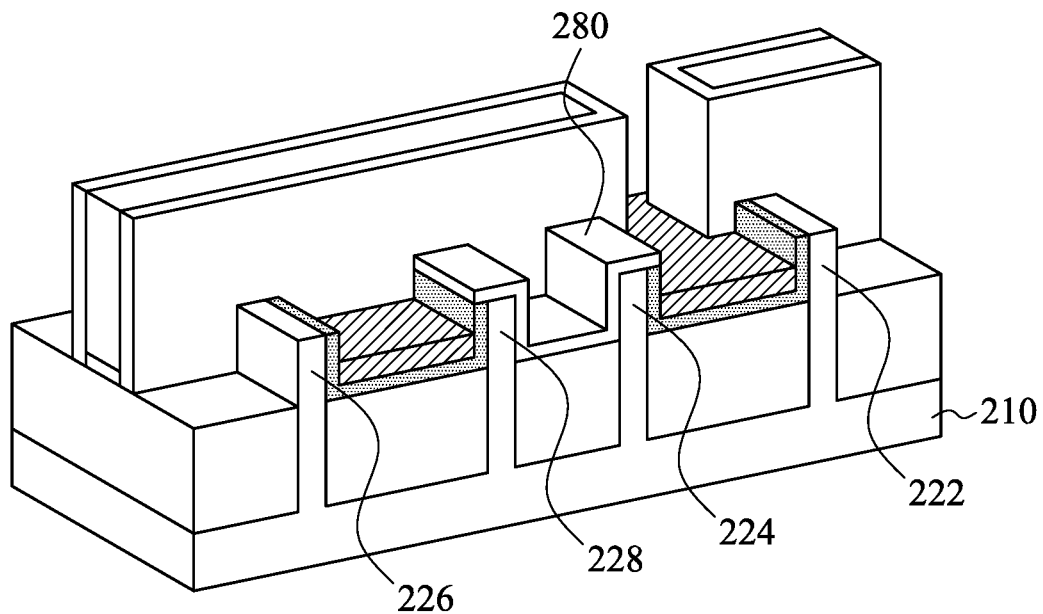
Figure 8B:
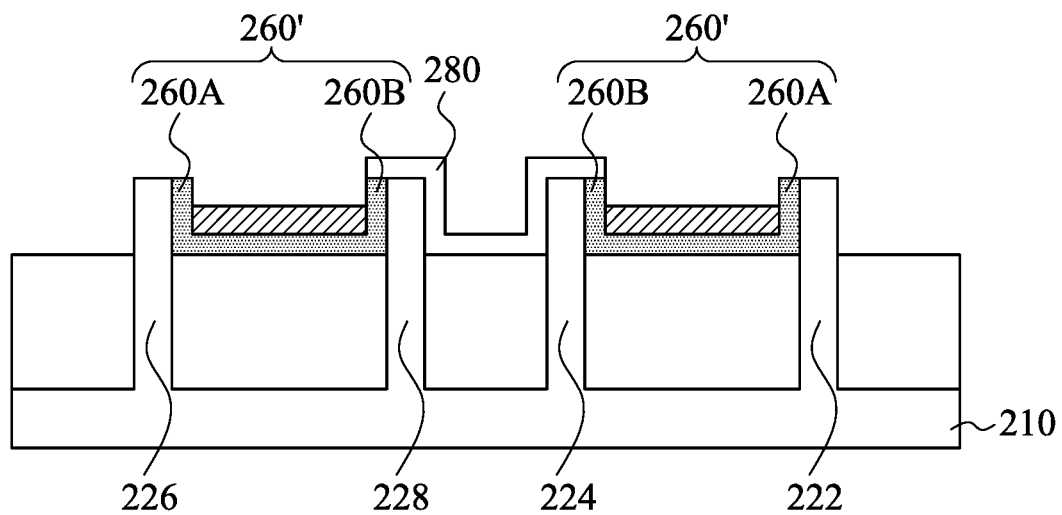

Reference is made to FIGS. 8A and 8B. A mask layer 280 is formed over the substrate 210, and covers the semiconductor fins 224 and 228. That is, the semiconductor fins 222 and 226 are exposed, and the semiconductor fins 224 and 228 are protected by the mask layer 280 during process(es) performed later. On the other hands, one of the spacers 260' includes a first side 260A and a second side 260B opposite to the first side 260A, in which the mask layer 280 covers the second side 260B and expose the first side 260A. The mask layer 280 may be formed by one or more suitable process(es) including various deposition, photolithography, and/or etching processes.

The mask layer 280, in some embodiments, is a hard mask layer which includes silicon oxide. The mask layer 280, in some other embodiments, may include silicon nitride (SiN), silicon oxynitride (SiON), silicon carbide (SiC), SiOC, spin-on glass (SOG), a low-κ film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof.

Figure 9A:
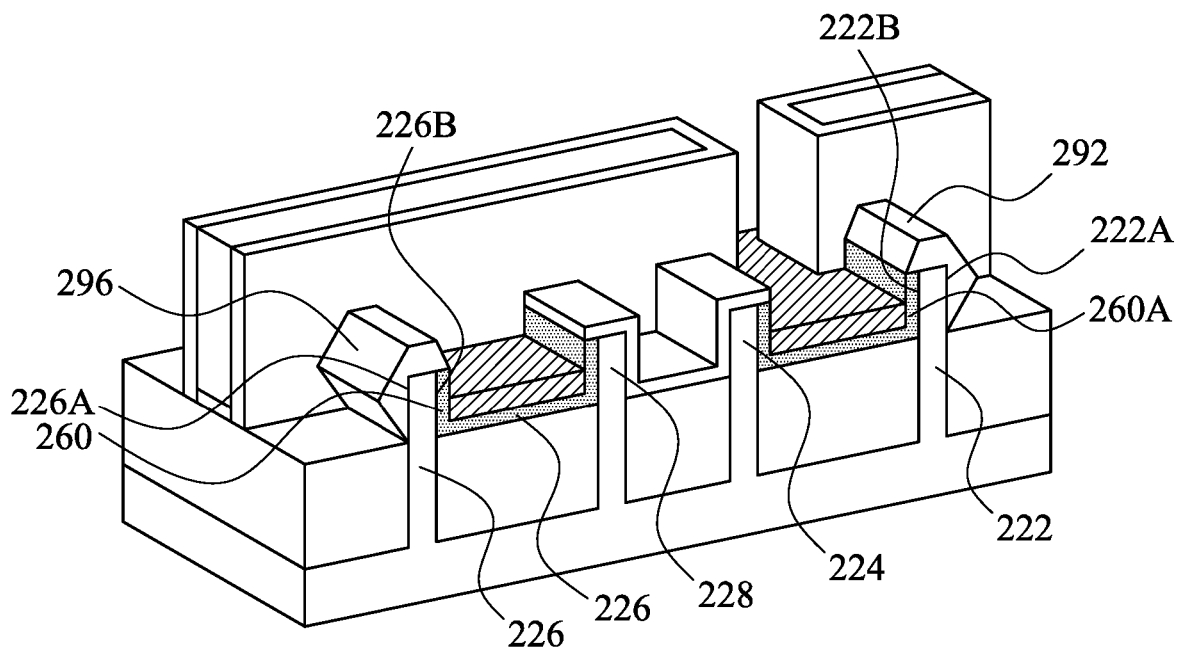
Figure 9B:
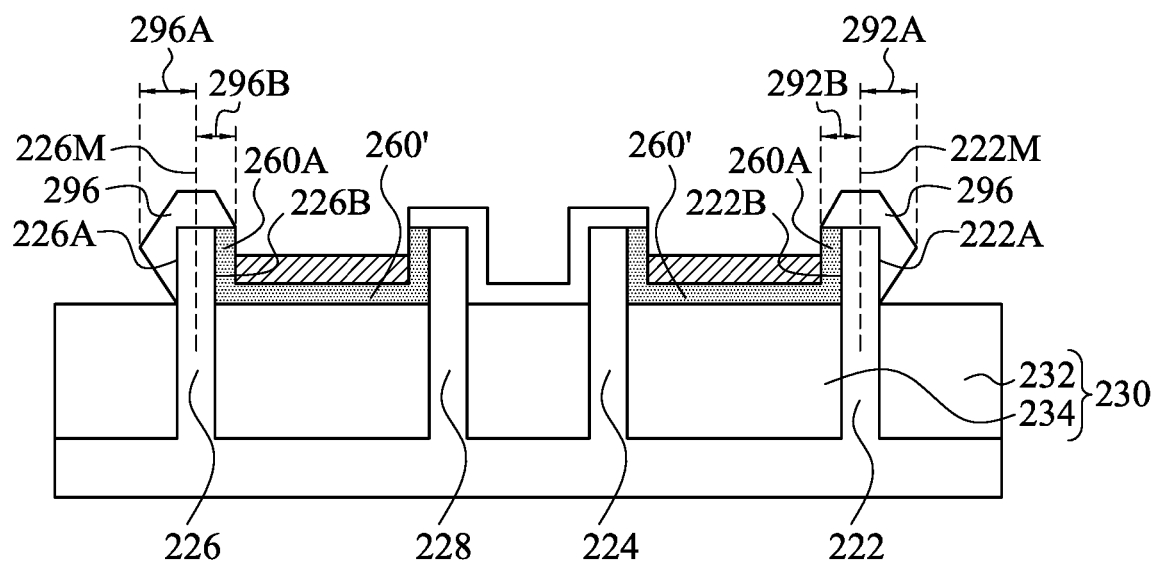

Reference is made to FIGS. 9A and 9B. A plurality of epitaxy structures 292 and 296 are formed respectively on the semiconductor fins 222 and 226. The epitaxy structure 292 is in contact with a sidewall 222A of the semiconductor fin 222, and the epitaxy structure 296 is in contact with a sidewall 226A of the semiconductor fin 226, respectively. On the other hands, another sidewall 222B opposite to the sidewall 222A is in contact with one of the spacers 260', and another sidewall 226B opposite to the sidewall 226A is in contact with one of the spacers 260', respectively. Moreover, a portion of the epitaxy structure 292 extends past the sidewall 222B of the semiconductor fin 222 and disposed on the first side 260A of the spacer 260', and a portion of the epitaxy structure 296 extends past the sidewall 226B of the semiconductor fin 226 and disposed on the first side 260A of the spacer 260'. The epitaxy structures 292 and 296 are in contact with the first sides 260A of the spacers 260'.

Referring to FIG. 9B, since the spacers 260' are formed respectively on the sidewall 222B and the sidewall 226B, the profile of the epitaxy structures 292 and 296 are asymmetric. The profile of the epitaxy structure 292 is asymmetric with respect to the semiconductor fin 222, and profile of the epitaxy structure 296 is asymmetric with respect to the semiconductor fin 226. In greater detail, a line 222M is defined as a middle line of the semiconductor fin 222, in which the distance between the line 222M and the sidewall 222A is substantially equal to the distance between the line 222M and the sidewall 222B. The epitaxy structure 292 has a width 292A along a direction from the line 222M toward the sidewall 222A and a width 292B along a direction from the line 222M toward the sidewall 222B. Since the spacer 260' limits the lateral growth of the epitaxy structure 292, the width 292B is smaller than the width 292A. Similarly, the epitaxy structure 296 has a width 296A along a direction from the line 226M toward the sidewall 226A and a width 296B along a direction from the line 226M toward the sidewall 226B, in which the width 296B is smaller than the width 296A. The term "substantially" as used herein may be applied to modify any quantitative representation which could permissibly vary without resulting in a change in the basic function to which it is related.

The epitaxy structure 292 covers the sidewall 222A, and the epitaxy structure 296 covers the sidewall 226A, respectively. That is, the epitaxy structure 292 covers a sidewall of the semiconductor fin 222 opposite to the semiconductor fin 224, and the epitaxy structure 296 covers a sidewall of the semiconductor fin 226 opposite to the semiconductor fin 228. Moreover, the isolation structure 230 may be separated into a first isolation structure 232 and a second isolation structure 234, in which the first isolation structure 232 and the second isolation structure 234 are disposed respectively on the sidewalls 222A and 222B of the semiconductor fin 222. In greater detail, the epitaxy structure 290 is disposed on the first isolation structure 232, and the spacer 260' is disposed on the second isolation structure 234.

The epitaxy structures 292 and 296 may be formed using one or more epitaxy or epitaxial (epi) processes, such that Si features, SiGe features, and/or other suitable features can be formed in a crystalline state on the semiconductor fins 222 and 226. In some embodiments, lattice constants of the epitaxy structures 292 and 296 is different from lattice constants of the semiconductor fins 222 and 226, and the epitaxy structures 292 and 296 is strained or stressed to enable carrier mobility of the semiconductor device and enhance the device performance. The epitaxy structures 292 and 296 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, the epitaxy structures 292 and 296 may include SiP, SiC, SiPC, Si, III-V compound semiconductor materials, or combinations thereof for the n-type epitaxy structure, and the epitaxy structures 292 and 296 may include SiGe, SiGeC, Ge, Si, III-V compound semiconductor materials, or combinations thereof for the p-type epitaxy structure. During the formation of the n-type epitaxy structure, n-type impurities such as phosphorous or arsenic may be doped with the proceeding of the epitaxy. For example, when the epitaxy structures 292 and 296 include SiC or Si, n-type impurities are doped. Moreover, during the formation of the p-type epitaxy structure, p-type impurities such as boron or $BF_2$ may be doped with the proceeding of the epitaxy. For example, when the epitaxy structures 292 and 296 include SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 222 and 226 (e.g., silicon). Thus, a strained channel can be achieved to increase carrier mobility and enhance device performance. The epitaxy structures 292 and 296 may be in-situ doped. If the epitaxy structures 292 and 296 are not in-situ doped, a second implantation process (i.e., a junction implant process) is performed to dope the epitaxy structures 292 and 296. One or more annealing processes may be performed to activate the epitaxy structures 292 and 296. The annealing processes include rapid thermal annealing (RTA) and/or laser annealing processes.

Figure 10A:
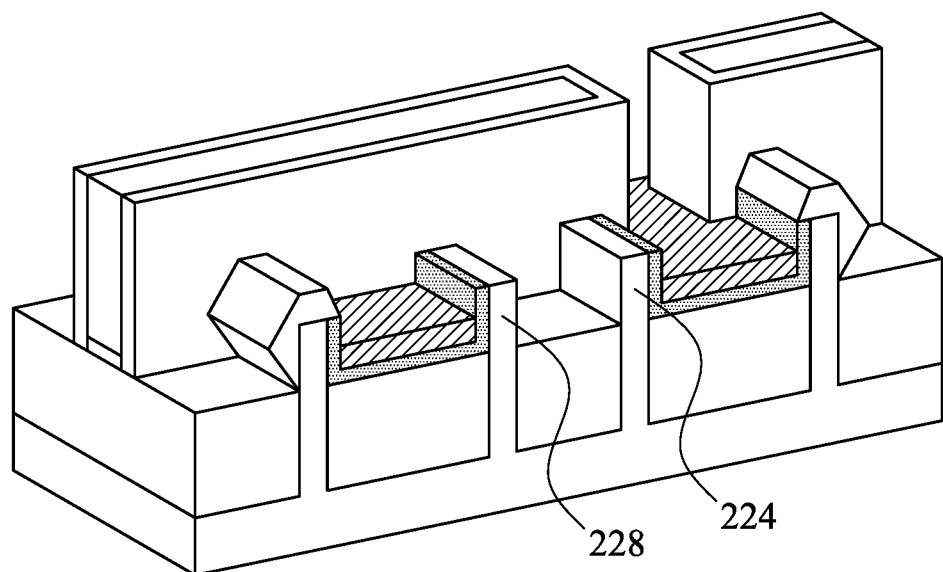
Figure 10B:
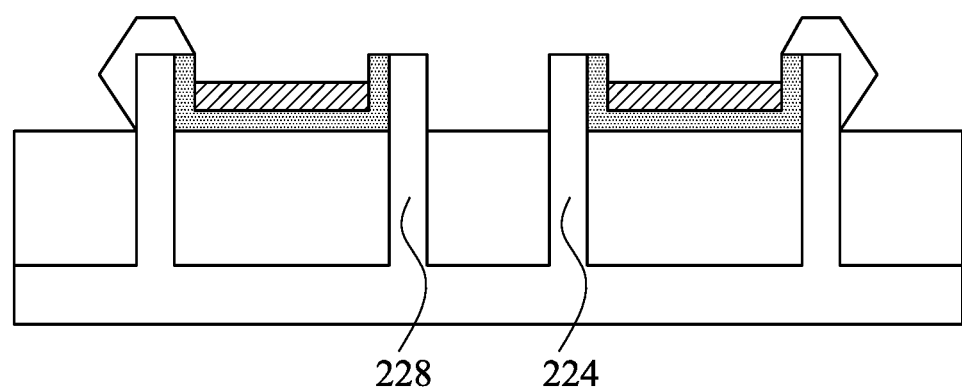

Reference is made to FIGS. 10A and 10B. The mask layer 280 (see FIGS. 8A and 8B) is removed to expose the semiconductor fins 224 and 228. The mask layer 280 may be removed by suitable process(es), such as etching.

Figure 11A:
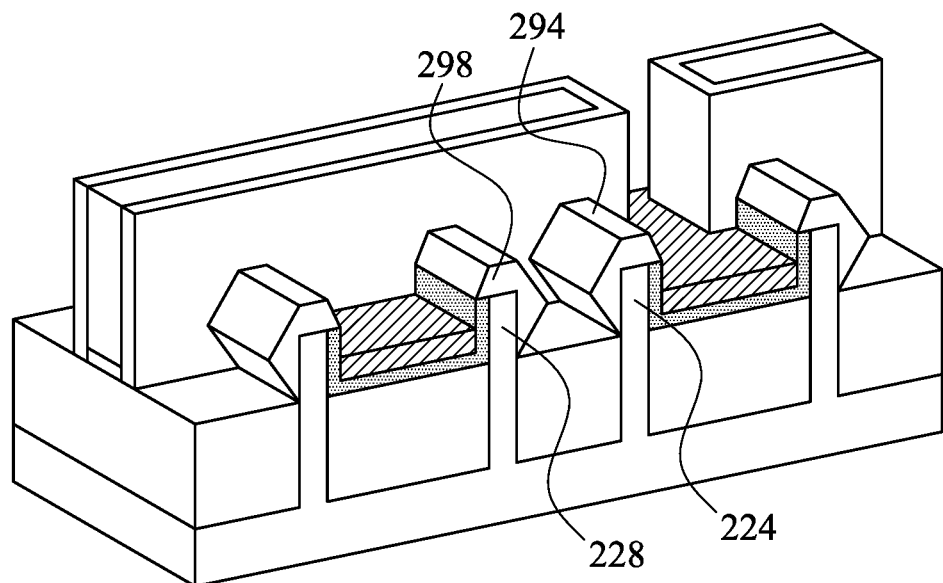
Figure 11B:
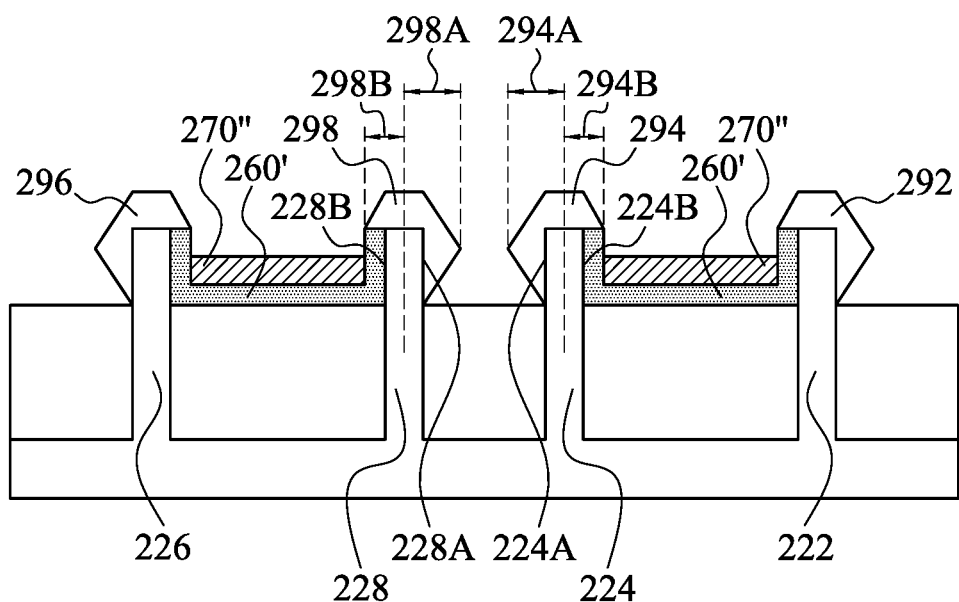

Reference is made to FIGS. 11A and 11B. A plurality of epitaxy structures 294 and 298 are formed respectively on the semiconductor fins 224 and 228. During the formation of the epitaxy structures 294 and 298, another mask layer (not shown) may be formed on the epitaxy structures 292 and 296. The epitaxy structures 292, 294, 296, and 298 are separated from each other. The epitaxy structure 294 is in contact with a sidewall 224A of the semiconductor fin 224, and the epitaxy structure 298 is in contact with a sidewall 228A of the semiconductor fin 228, respectively. On the other hands, another sidewall 224B opposite to the sidewall 224A is in contact with one of the spacers 260', and another sidewall 228B opposite to the sidewall 228A is in contact with one of the spacers 260', respectively. Moreover, a portion of the epitaxy structure 294 extends past the sidewall 224B of the semiconductor fin 224 and disposed on the spacer 260', and a portion of the epitaxy structure 298 extends past the sidewall 228B of the semiconductor fin 228 and disposed on the spacer 260'. In some embodiments, the epitaxy structures 294 and 298 may be p-type epitaxy structures in n-well region, and the epitaxy structures 292 and 296 may be n-type epitaxy structures in p-well region. Thus, one of the spacers 260' and the dielectric material 270" are disposed between one n-type epitaxy structure and one p-type epitaxy structure, such as the epitaxy structure 292 and 294, or the epitaxy structure 296 and 298.

Referring to FIG. 11B, similar to FIG. 9B, the profile of the epitaxy structure 294 is asymmetric with respect to the semiconductor fin 224, and the profile of the epitaxy structure 298 is asymmetric with respect to the semiconductor fin 228. The epitaxy structure 294 has a width 294A along a direction from the line 224M toward the sidewall 224A and a width 294B along a direction from the line 224M toward the sidewall 224B. Since the spacer 260' limits the lateral growth of the epitaxy structure 294, the width 294B is smaller than the width 294A. Similarly, the epitaxy structure 298 has a width 298A along a direction from the line 228M toward the sidewall 228A and a width 298B along a direction from the line 228M toward the sidewall 228B, in which the width 298B is smaller than the width 298A.

Figure 12A:
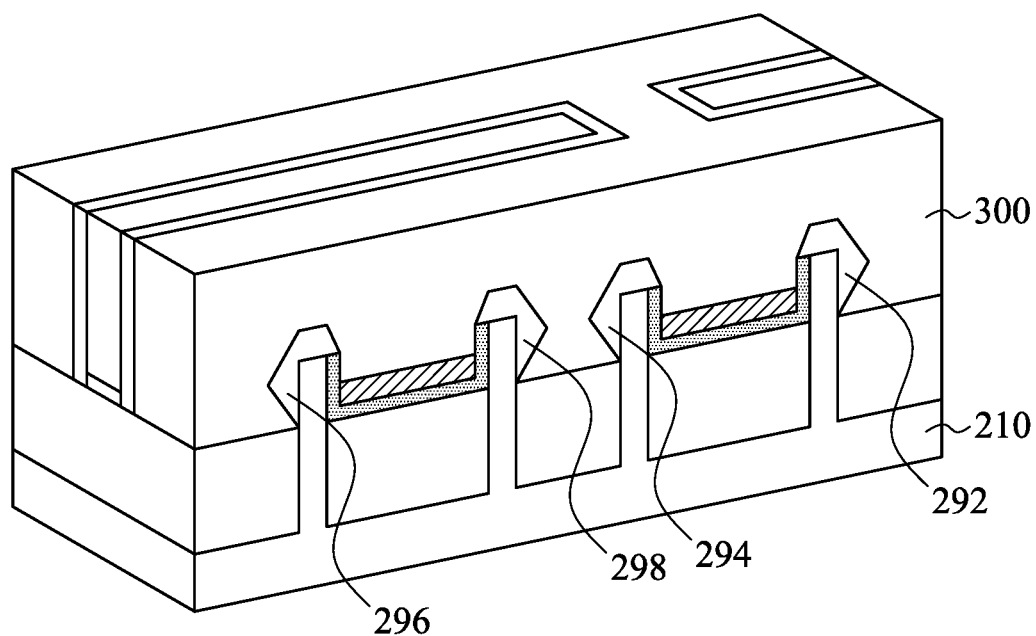
Figure 12B:
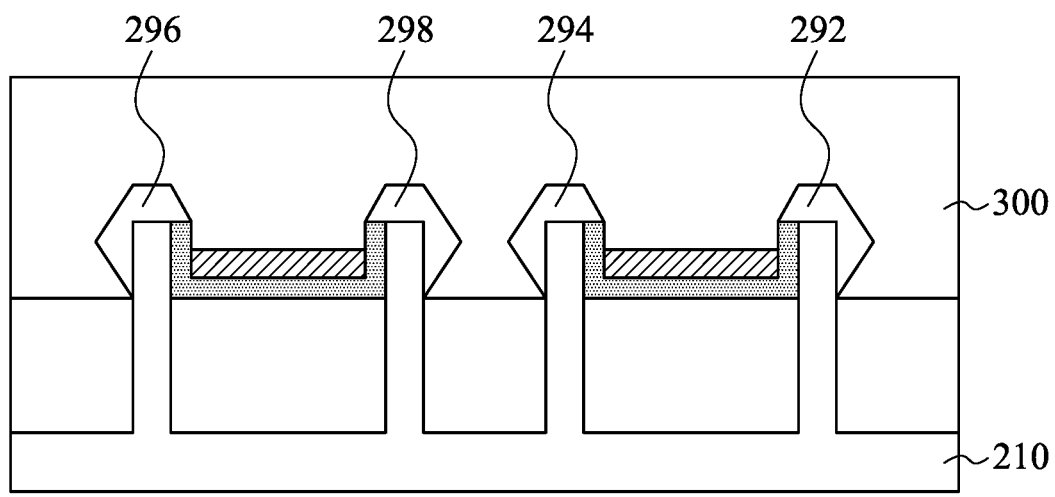

Reference is made to FIGS. 12A and 12B. An interlayer dielectric 300 is formed over the substrate 210 and at outer sides of the gate spacers 250. Accordingly, the interlayer dielectric 300 covers the epitaxy structures 292, 294, 296 and 298. The interlayer dielectric 300 may include silicon oxide, oxynitride or other suitable materials. The interlayer dielectric 300 includes a single layer or multiple layers. The interlayer dielectric 300 can be formed by a suitable technique, such as CVD or ALD. A chemical mechanical planarization (CMP) process may be applied to remove excessive interlayer dielectric 300. Another recessing process may be performed to the dielectric layer to form a plurality of openings (not shown) that expose the epitaxy structures 292, 294, 296 and 298. Metal such as tungsten is then deposited into the openings down to the epitaxy structures 292, 294, 296 and 298 to form source/drain contacts (not shown) in the interlayer dielectric 300.

Figure 13:
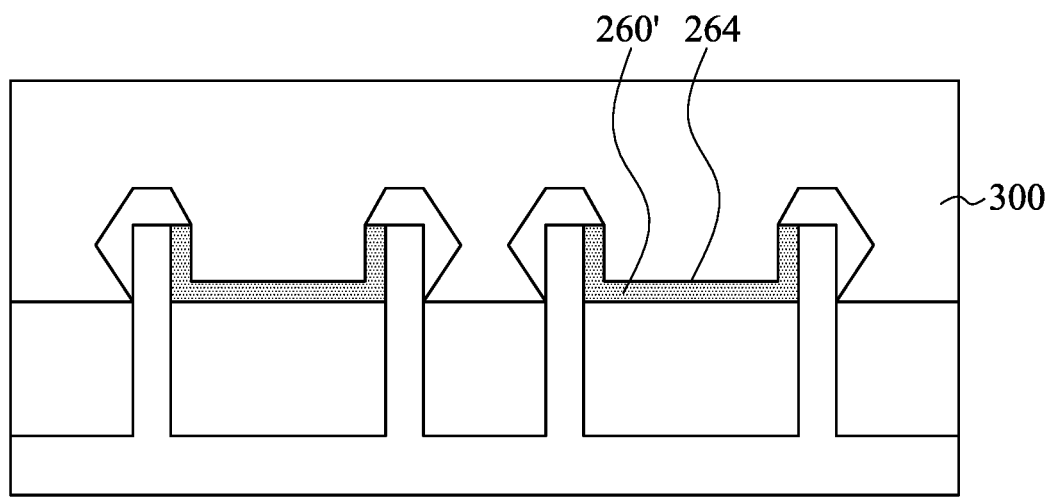
FIGS. 13 and 14 are cross-sectional views of a semiconductor device in accordance with some embodiments of the present disclosure.
Figure 14:
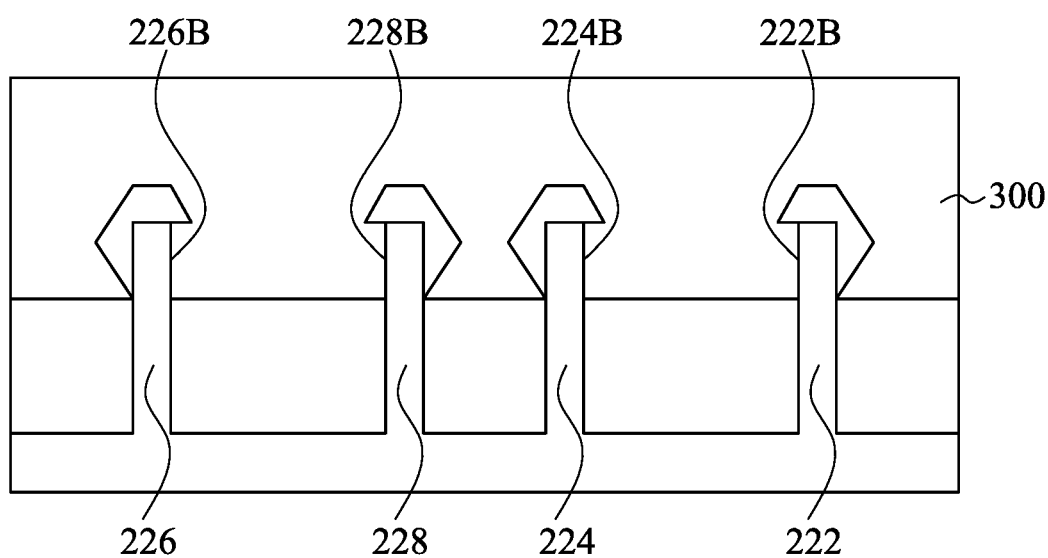

FIGS. 13 and 14 are cross-sectional views of an SRAM device in accordance with some embodiments of the present disclosure.

Reference is made to FIG. 13. The dielectric materials 270" (see FIGS. 11A and 11B) may be removed or omitted in some embodiments. Thus, the interlayer dielectric 300 is in contact with the surface 264 of the spacers 260'. Other relevant structural and manufacturing details of the SRAM device of FIG. 13 are similar to the SRAM device of FIG. 12B, and, therefore, a description in this regard will not be repeated hereinafter.

Reference is made to FIG. 14. The spacers 260' and the dielectric materials 270 (see FIGS. 11A and 11B) may be removed after forming the epitaxy structures 292, 294, 296, and 298 (see FIGS. 11A and 11B). Accordingly, the interlayer dielectric 300 is in contact with the sidewalls 222B, 22B, 226B, and 228B of the semiconductor fins 222, 224, 226, and 228, respectively. In some embodiments, the spacers 260' and the dielectric materials 270 may be removed by one or more suitable process(es), such as etching. Other relevant structural and manufacturing details of the SRAM device of FIG. 14 are similar to the SRAM device of FIG. 12B, and, therefore, a description in this regard will not be repeated hereinafter.

Figure 15A:
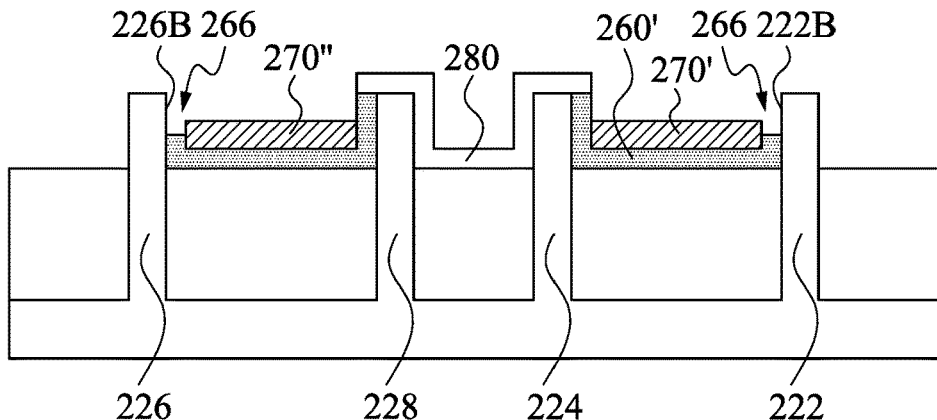
FIGS. 15A to 15C are cross-sectional views of a method for manufacturing a semiconductor device at various stages in accordance with some embodiments of the present disclosure.
Figure 15B:
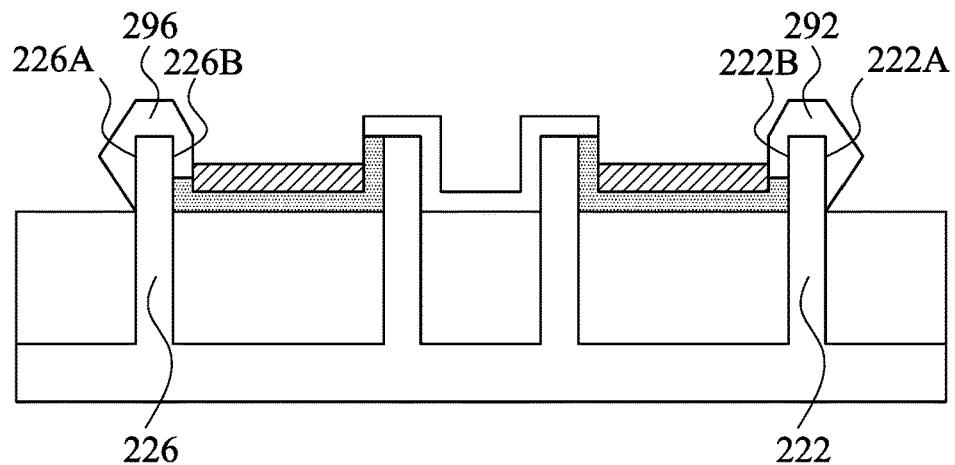
Figure 15C:
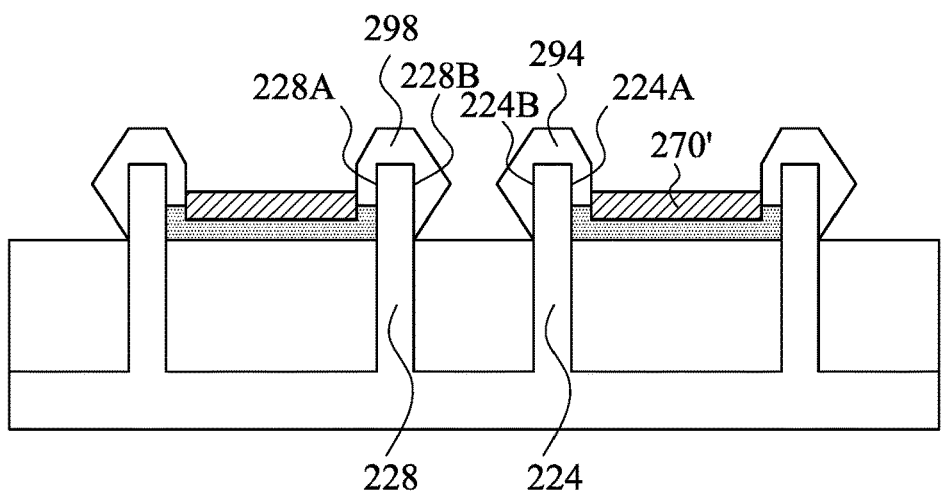

FIGS. 15A to 15C are cross-sectional views of a method for manufacturing an SRAM device at various stages in accordance with some embodiments of the present disclosure.

Reference is made to FIG. 15A. After the mask layer 280 is formed (see FIGS. 8A and 8B) to cover the semiconductor fins 224 and 228, an etching back process is performed to the spacers 260' to partially remove the spacers 260' on the sidewall 222B and the sidewall 226B. Thus, a plurality of recesses 266 are formed between the semiconductor fin 222 and the dielectric material 270", and between the semiconductor fin 226 and the dielectric material 270". Accordingly, portions of the sidewall 222B of the semiconductor fin 222 and portions of the sidewall 226B of the semiconductor fin 226 are exposed.

Reference is made to FIG. 15B. A plurality of epitaxy structures 292 and 296 are formed respectively on the semiconductor fins 222 and 226. The epitaxy structure 292 is in contact with the sidewall 222A of the semiconductor fin 222, and the epitaxy structure 296 is in contact with the sidewall 226A of the semiconductor fin 226, respectively. Further, due to the etching back process, the epitaxy structures 292 and 296 formed respectively in the recesses 266 (see FIG. 15A). Accordingly, the epitaxy structure 292 is in contact with portions of the sidewall 222B of the semiconductor fin 222, and the epitaxy structure 296 is in contact with portions of the sidewall 226B of the semiconductor fin 226, respectively.

Reference is made to FIG. 15C. Similar to FIG. 15B, after the epitaxy structures 292 and 296 are formed, the mask layer 280 is removed, and another etching back process is performed to the spacers 260' to expose portions of the sidewall 224B of the semiconductor fin 224 and portions of the sidewall 228B of the semiconductor fin 228. A plurality of epitaxy structures 294 and 298 are formed respectively on the semiconductor fins 224 and 228. The epitaxy structure 294 is in contact with the sidewall 224A of the semiconductor fin 224, and the epitaxy structure 298 is in contact with the sidewall 228A of the semiconductor fin 228, respectively. Further, the epitaxy structure 294 is in contact with portions of the sidewall 224B of the semiconductor fin 224, and the epitaxy structure 298 is in contact with portions of the sidewall 228B of the semiconductor fin 228, respectively. Other relevant structural and manufacturing details of the SRAM device of FIG. 15C are similar to the SRAM device of FIG. 12B, and, therefore, a description in this regard will not be repeated hereinafter.

Figure 16:
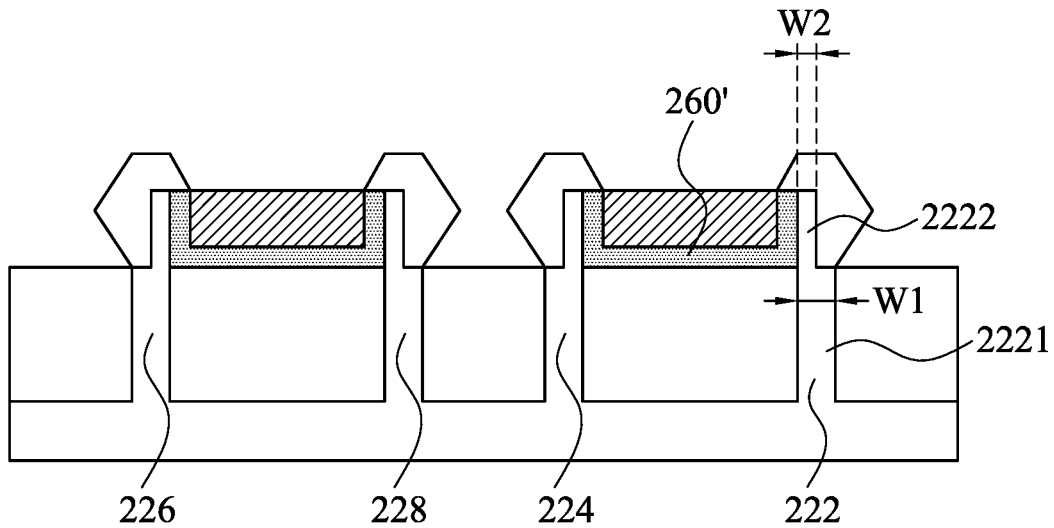
FIGS. 16 and 17 are cross-sectional views of a semiconductor device in accordance with some embodiments of the present disclosure.
Figure 17:
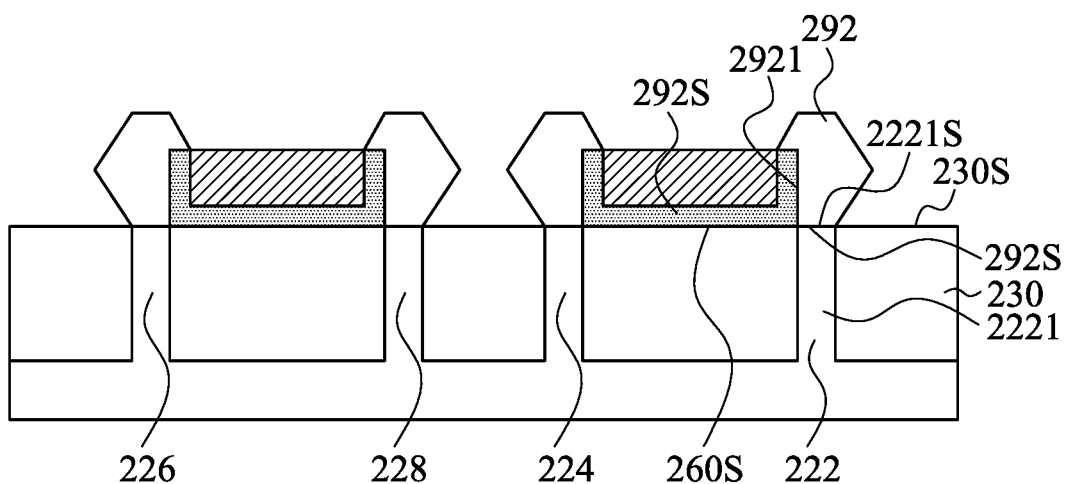

FIGS. 16 and 17 are cross-sectional views of an SRAM device in accordance with some embodiments of the present disclosure.

Reference is made to FIG. 16. After the spacers 260' are formed, the semiconductor fins 222, 224, 226, and 228 are trimmed by suitable process(es), such as etching. For example, after the semiconductor fin 222 is trimmed, the semiconductor fin 222 includes a bottom portion 2221 having a width W1 and a top portion 2222 having a width W2, in which the width W2 is less than the width W1. Other relevant structural and manufacturing details of the semiconductor fins 224, 226, and 228 are similar to the semiconductor fin 222, and, therefore, a description in this regard will not be repeated. Also, other relevant structural and manufacturing details of the SRAM device of FIG. 16 are similar to the SRAM device of FIG. 12B, and, therefore, a description in this regard will not be repeated hereinafter.

Reference is made to FIG. 17. After the spacers 260' are formed, the semiconductor fins 222, 224, 226, and 228 are partially removed by suitable process(es), such as etching. As a result, for example, a top portion (not shown) of the semiconductor fin 222 is removed, and a bottom portion 2221 of the semiconductor fin 222 remains in the isolation structures 230. Thus, an epitaxy structure 292 is formed on the bottom portion 2221 of the semiconductor fin 222, and the epitaxy structure 292 has a sidewall 2921 in contact with a spacer 260'. In some embodiments, a bottom surface 292S of the epitaxy structure 292 and a bottom surface 260S of the spacer 260' are substantially coplanar. The top surface 230S of the isolation structures 230 and the top surface top surface 2221S of the bottom portion 2221 of the semiconductor fin 222 are substantially coplanar. Moreover, the bottom surface 292S of the epitaxy structure 292 is in contact with the top surface 2221S of the bottom portion 2221 of the semiconductor fin 222. Other relevant structural and manufacturing details of the semiconductor fins 224, 226, and 228 are similar to the semiconductor fin 222, and, therefore, a description in this regard will not be repeated. Also, other relevant structural and manufacturing details of the SRAM device of FIG. 17 are similar to the SRAM device of FIG. 12B, and, therefore, a description in this regard will not be repeated hereinafter.

Figure 18A:
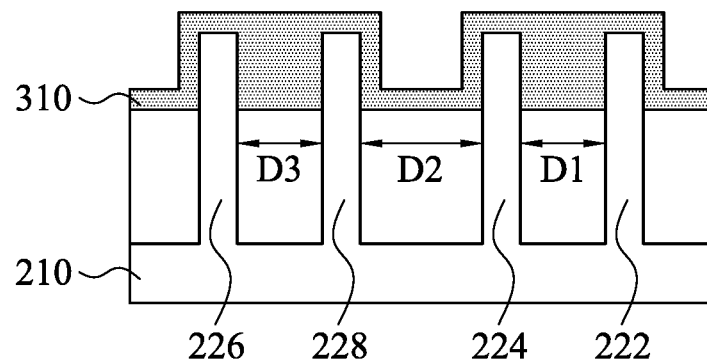
FIGS. 18A to 18C are cross-sectional views of a method for manufacturing a semiconductor device at various stages in accordance with some embodiments of the present disclosure.
Figure 18B:
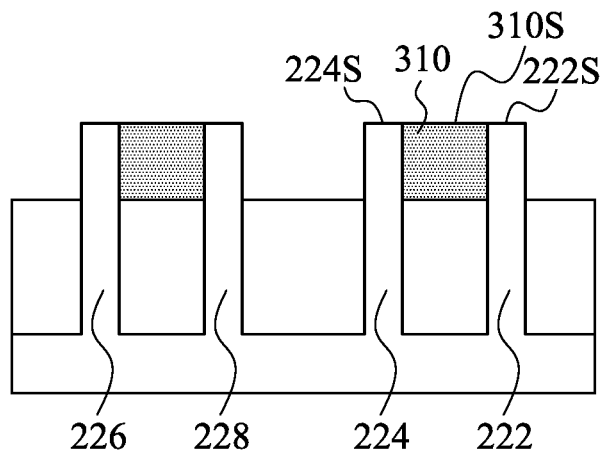
Figure 18C:
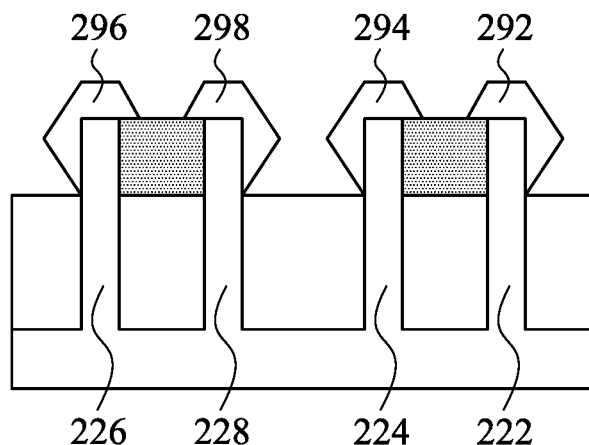

FIGS. 18A to 18C are cross-sectional views of a method for manufacturing an SRAM device at various stages in accordance with some embodiments of the present disclosure.

Reference is made to FIG. 18A. A plurality of semiconductor fins 222, 224, 226, and 228 are formed on a substrate 210. The semiconductor fins 222 and 224 have a distance D1 therebetween, the semiconductor fins 224 and 228 have a distance D2 therebetween, and the semiconductor fins 228 and 226 have a distance D3 therebetween, in which the distances D1 and D3 are less than the distance D2.

A spacer layer 310 is formed over the substrate 210. In some embodiments, due to the small distances between the semiconductor fins, such as the distances D1 and D3, the spacer layer 310 may be merged between the semiconductor fins 222 and 224, and between the semiconductor fins 222 and 224.

Reference is made to FIG. 18B. The spacer layer 310 (see FIG. 18A) is patterned to form a plurality of spacers 310. In some embodiments, a top surface 310S of the spacers 310', a top surface 222S of the semiconductor fin 222, and a top surface 224S of the semiconductor fin 224 are substantially coplanar. Other relevant structural and manufacturing details of the spacers 310' between the semiconductor fins 226, and 228 are similar, and, therefore, a description in this regard will not be repeated.

Reference is made to FIG. 18C. A plurality of epitaxy structures 292, 294, 296, and 298 are formed respectively on the semiconductor fins 222, 224, 226, and 228. The formation of the epitaxy structures 292, 294, 296, and 298 is similar to the method shown in FIGS. 7A to 11A, and, therefore, a description in this regard will not be repeated. Other relevant structural and manufacturing details of the SRAM device of FIG. 18C are similar to the SRAM device of FIG. 12B, and, therefore, a description in this regard will not be repeated hereinafter.

Figure 19:
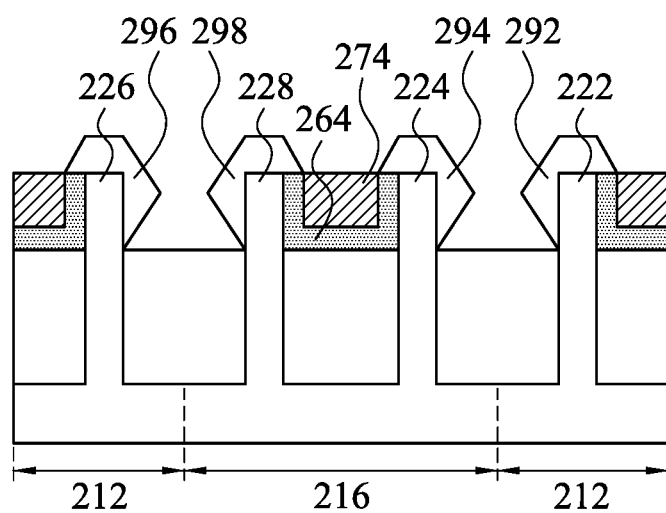
FIG. 19 is cross-sectional view of a semiconductor device in accordance with some embodiments of the present disclosure.

FIG. 19 is cross-sectional view of a semiconductor device in accordance with some embodiments of the present disclosure. Two p-well regions 212 and one n-well region 216 are formed in the substrate 210. In some embodiments, the p-well regions 212 and the n-well region 216 may be plural, as described in FIG. 2A. The n-well region 216 is formed between two p-well regions 212.

A plurality of semiconductor fins 222, 224, 226, and 228 are formed on a substrate 210, in which the semiconductor fins 224 and 228 are formed in the n-well region 216, and the semiconductor fins 222 and 226 are formed respectively in the p-well regions 212. A plurality of spacers 264 and dielectric materials 274 are formed over the substrate 210 and between at least two semiconductor fins. For example, in FIG. 19, one of the spacers 264 and dielectric materials 274 are formed between semiconductor fins 224 and 228 in the n-well region 216.

A plurality of epitaxy structures 292, 294, 296, and 296 are formed respectively on the semiconductor fins 222, 224, 226, and 228. The epitaxy structures 224 and 228 may be p-type epitaxy structures in the n-well region 216, and the epitaxy structures 222 and 226 may be n-type epitaxy structures in the p-well regions 212. Accordingly, at least one of the spacers 264 and dielectric materials 274 are formed between two p-type epitaxy structures, such as the epitaxy structures 224 and 228. In some embodiments, the at least one of the spacers 264 and dielectric materials 274 are formed between two n-type epitaxy structures. Other relevant structural and manufacturing details of the SRAM device of FIG. 19 are similar to the SRAM device of FIG. 12B, and, therefore, a description in this regard will not be repeated hereinafter.

According to the aforementioned embodiments, a spacer is formed between the semiconductor fins, such that epitaxy structures formed on the semiconductor fins may be formed asymmetrically with respect to the semiconductor fins. One side of a width of the epitaxy structures may be reduced due to the confinement of the spacer. Thus, a distance between the semiconductor fins may be reduced while the adjacent epitaxy structures are separated from each other, and the device may scale down accordingly. With this configuration, the performance of the semiconductor device can be improved.

According to some embodiments of the present disclosure, a method includes forming a first semiconductor fin and a second semiconductor fin over a substrate, in which the first semiconductor fin has opposite first and second sidewalls and the second semiconductor fin has opposite first and second sidewalls, and the second sidewall of the first semiconductor fin faces the second sidewall of the second semiconductor fin; forming an shallow trench isolation (STI) structure on the substrate and between the first semiconductor fin and the second semiconductor fin; forming a spacer layer on the first semiconductor fin, the second semiconductor fin, and the STI structure; patterning the spacer layer to form a spacer extending along the second sidewall of the first semiconductor fin, a top surface of the STI structure, and the second sidewall of the second semiconductor fin; forming a first epitaxy structure in contact with a top surface of the first semiconductor fin and the first sidewall of the first semiconductor fin; and forming a second epitaxy structure in contact with a top surface of the second semiconductor fin and the first sidewall of the second semiconductor fin.

According to some embodiments of the present disclosure, a method includes forming a first semiconductor fin and a second semiconductor fin over a substrate, in which the first semiconductor fin has opposite first and second sidewalls and the second semiconductor fin has opposite first and second sidewalls, and the second sidewall of the first semiconductor fin faces the second sidewall of the second semiconductor fin; forming a spacer extending from the second sidewall of the first semiconductor fin to the second sidewall of the second semiconductor fin, in which the first sidewall of the first semiconductor fin and the first sidewall of the second semiconductor fin are free from coverage of the spacer; forming a mask layer covering a top surface and the first sidewall of the second semiconductor fin, in which the mask layer is in contact with the spacer; forming a first epitaxy structure in contact with a top surface of the first semiconductor fin and the first sidewall of the first semiconductor fin; after forming the first epitaxy structure, removing the mask layer to expose the top surface and the first sidewall of the second semiconductor fin; and forming a second epitaxy structure in contact with a top surface of the second semiconductor fin and the first sidewall of the second semiconductor fin.

According to some embodiments of the present disclosure, a method includes forming a first semiconductor fin and a second semiconductor fin over a substrate, in which the first semiconductor fin has opposite first and second sidewalls and the second semiconductor fin has opposite first and second sidewalls, and the second sidewall of the first semiconductor fin faces the second sidewall of the second semiconductor fin; forming a spacer extending from the second sidewall of the first semiconductor fin to the second sidewall of the second semiconductor fin, in which the first sidewall of the first semiconductor fin and the first sidewall of the second semiconductor fin are free from coverage of the spacer; forming a dielectric layer over the spacer and between the first semiconductor fin and the second semiconductor fin; forming a first epitaxy structure in contact with a top surface of the first semiconductor fin and the first sidewall of the first semiconductor fin; and forming a second epitaxy structure in contact with a top surface of the second semiconductor fin and the first sidewall of the second semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming a first semiconductor fin and a second semiconductor fin over a substrate, wherein the first semiconductor fin has opposite first and second sidewalls and the second semiconductor fin has opposite first and second sidewalls, and the second sidewall of the first semiconductor fin faces the second sidewall of the second semiconductor fin;
forming an shallow trench isolation (STI) structure on the substrate and between the first semiconductor fin and the second semiconductor fin;
forming a spacer layer on the first semiconductor fin, the second semiconductor fin, and the STI structure;
patterning the spacer layer to form a spacer extending along the second sidewall of the first semiconductor fin, a top surface of the STI structure, and the second sidewall of the second semiconductor fin;
forming a dielectric material over the spacer;
after forming the dielectric material over the spacer, forming a first epitaxy structure in contact with a top surface of the first semiconductor fin and the first sidewall of the first semiconductor fin; and forming a second epitaxy structure in contact with a top surface of the second semiconductor fin and the first sidewall of the second semiconductor fin.

2. The method of claim 1, wherein patterning the spacer layer is performed such that a top surface of the first semiconductor fin and a top surface of the second semiconductor fin are free from coverage of the spacer.

3. The method of claim 1, further comprising etching the spacer such that a topmost surface of the spacer is lower than a top surface of the first semiconductor fin.

4. The method of claim 1, wherein forming the first epitaxy structure is performed such that the first epitaxy structure is in contact with the spacer.

5. The method of claim 1, further comprising:
forming a mask layer covering the top surface of the second semiconductor fin prior to forming the first epitaxy structure; and
removing the mask layer after forming the first epitaxy structure.

6. The method of claim 1, further comprising etching back the dielectric material.

7. A method, comprising:
forming a first semiconductor fin and a second semiconductor fin over a substrate, wherein the first semiconductor fin has opposite first and second sidewalls and the second semiconductor fin has opposite first and second sidewalls, and the second sidewall of the first semiconductor fin faces the second sidewall of the second semiconductor fin;
forming a spacer extending from the second sidewall of the first semiconductor fin to the second sidewall of the second semiconductor fin, wherein the first sidewall of the first semiconductor fin and the first sidewall of the second semiconductor fin are free from coverage of the spacer;
forming a mask layer covering a top surface and the first sidewall of the second semiconductor fin, wherein the mask layer is in contact with the spacer;
forming a first epitaxy structure in contact with a top surface of the first semiconductor fin and the first sidewall of the first semiconductor fin;
after forming the first epitaxy structure, removing the mask layer to expose the top surface and the first sidewall of the second semiconductor fin; and
forming a second epitaxy structure in contact with a top surface of the second semiconductor fin and the first sidewall of the second semiconductor fin.

8. The method of claim 7, further comprising etching the spacer after forming the mask layer and prior to forming the first epitaxy structure.

9. The method of claim 8, further comprising etching the spacer after forming the forming the first epitaxy structure and prior to forming the second epitaxy structure.

10. The method of claim 7, wherein forming the spacer comprises:
forming a spacer layer covering the first semiconductor fin and the second semiconductor fin; and
removing portions of the spacer layer from the first sidewall of the first semiconductor fin and the first sidewall of the second semiconductor fin.

11. The method of claim 7, wherein forming the first epitaxy structure is performed such that the first epitaxy structure is in contact with the second sidewall of the first semiconductor fin.

12. The method of claim 11, wherein forming the first epitaxy structure is performed such that the first epitaxy structure is in contact with the spacer.

13. The method of claim 7, wherein forming the first epitaxy structure is performed such that the first epitaxy structure has an asymmetric profile.

14. A method, comprising:
forming a first semiconductor fin and a second semiconductor fin over a substrate, wherein the first semiconductor fin has opposite first and second sidewalls and the second semiconductor fin has opposite first and second sidewalls, and the second sidewall of the first semiconductor fin faces the second sidewall of the second semiconductor fin;
forming a spacer extending from the second sidewall of the first semiconductor fin to the second sidewall of the second semiconductor fin, wherein the first sidewall of the first semiconductor fin and the first sidewall of the second semiconductor fin are free from coverage of the spacer;
forming a dielectric layer over the spacer and between the first semiconductor fin and the second semiconductor fin;
forming a first epitaxy structure in contact with a top surface of the first semiconductor fin and the first sidewall of the first semiconductor fin; and
forming a second epitaxy structure in contact with a top surface of the second semiconductor fin and the first sidewall of the second semiconductor fin.

15. The method of claim 14, further comprising etching the dielectric layer such that a top surface of the dielectric layer is lower than a top surface of a first end of the spacer.

16. The method of claim 15, further comprising, after etching the dielectric layer, etching the first end of the spacer such that the top surface of the first end of the spacer is lower than the top surface of the dielectric layer.

17. The method of claim 14, further comprising etching the dielectric layer such that a top surface of the dielectric layer is lower than a top surface of the first semiconductor fin.

18. The method of claim 14, wherein forming the first epitaxy structure is performed such that the first epitaxy structure is separated from the dielectric layer.

19. The method of claim 14, wherein forming the first epitaxy structure is performed such that the first epitaxy structure is in contact with the second sidewall of the first semiconductor fin.

20. The method of claim 1, further comprising forming an interlayer dielectric covering the first epitaxy structure and the second epitaxy structure.

* * * * *